(12) United States Patent (10) Patent No.: US 12,111,682 B2
Choi (45) Date of Patent: Oct. 8, 2024

(54) DELAY SYNCHRONIZATION PROCESSING DEVICE AND SIGNAL PROCESSING DEVICE INCLUDING SAME

(71) Applicant: LG ELECTRONICS INC., Seoul (KR)

(72) Inventor: Jongin Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 83 days.

(21) Appl. No.: 18/026,014

(22) PCT Filed: Sep. 14, 2020

(86) PCT No.: PCT/KR2020/012388
§ 371 (c)(1),
(2) Date: Mar. 13, 2023

(87) PCT Pub. No.: WO2022/055005
PCT Pub. Date: Mar. 17, 2022

(65) Prior Publication Data
US 2023/0367359 A1 Nov. 16, 2023

(51) Int. Cl.
*G06F 1/12* (2006.01)
*G06F 1/06* (2006.01)

(52) U.S. Cl.
CPC . *G06F 1/12* (2013.01); *G06F 1/06* (2013.01)

(58) Field of Classification Search
CPC .... G06F 1/06; G06F 1/10; H03K 3/84; H04N 5/04; H04N 21/43
See application file for complete search history.

(56) References Cited

U.S. PATENT DOCUMENTS

| | | | |
|---|---|---|---|
| 2002/0136277 A1* | 9/2002 | Reed | H04B 1/7105 375/E1.019 |
| 2005/0216247 A1* | 9/2005 | Ikeda | G06F 30/23 703/19 |
| 2013/0060565 A1* | 3/2013 | Nair | H04L 1/203 704/201 |

FOREIGN PATENT DOCUMENTS

| | | |
|---|---|---|
| KR | 10-0256190 B1 | 5/2000 |
| KR | 10-0354423 B1 | 9/2002 |
| KR | 10-0926469 B1 | 11/2009 |
| KR | 10-1235522 B1 | 2/2013 |
| KR | 10-1907413 B1 | 12/2018 |

* cited by examiner

*Primary Examiner* — Nitin C Patel
(74) *Attorney, Agent, or Firm* — Birch, Stewart, Kolasch & Birch, LLP

(57) ABSTRACT

The present disclosure relates to a delay synchronization processing apparatus and a signal processing apparatus provided with same. The delay synchronization processing apparatus according to one embodiment of the present disclosure comprises: a delay device to generate a random number and to delay an input asynchronous N-bit signal based on the generated random number; and a synchronization processor configured to perform synchronization processing on the asynchronous N-bit signal delayed by the delay device. Accordingly, errors during non-synchronous bit signal processing can be detected.

18 Claims, 19 Drawing Sheets

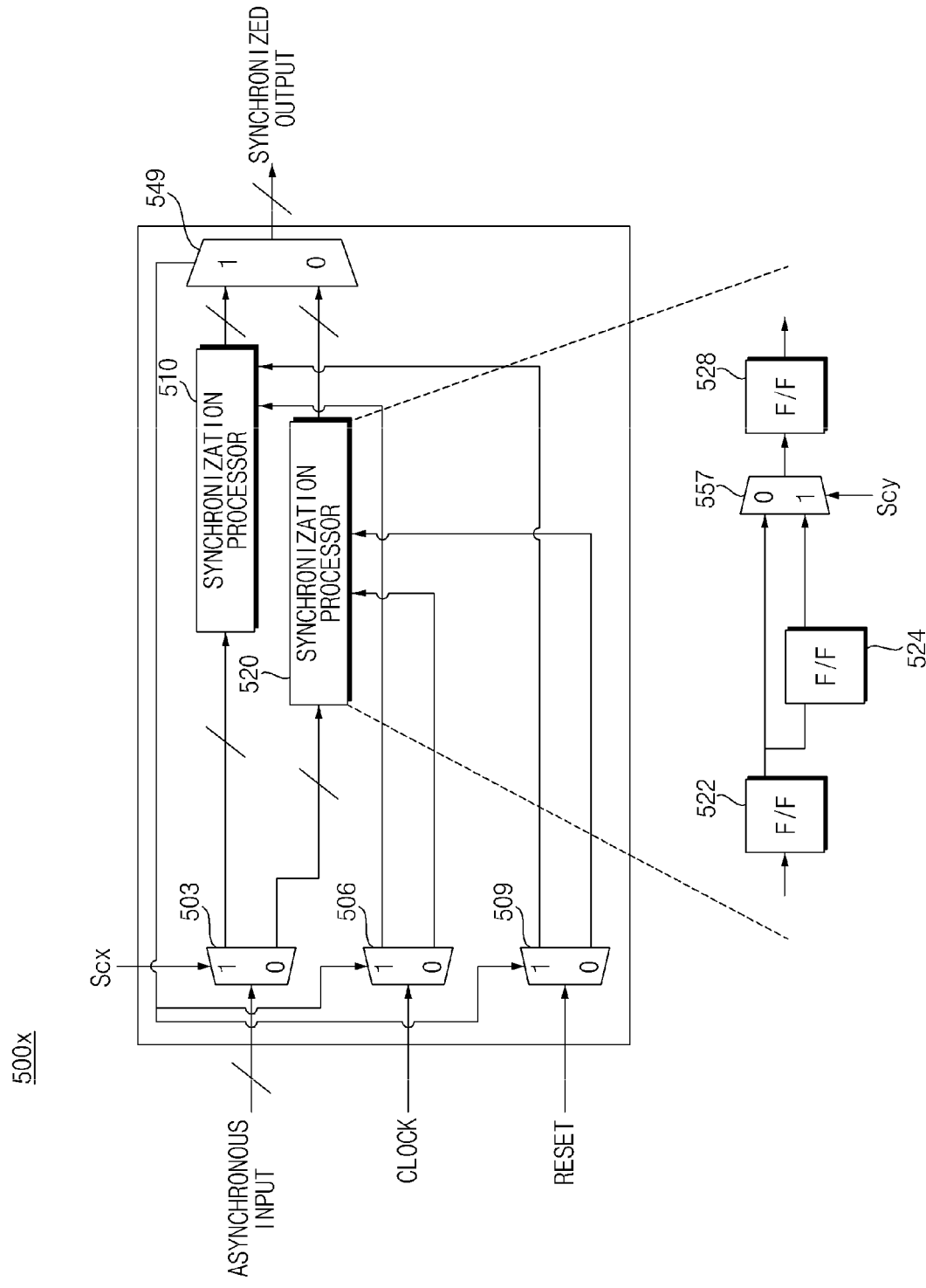

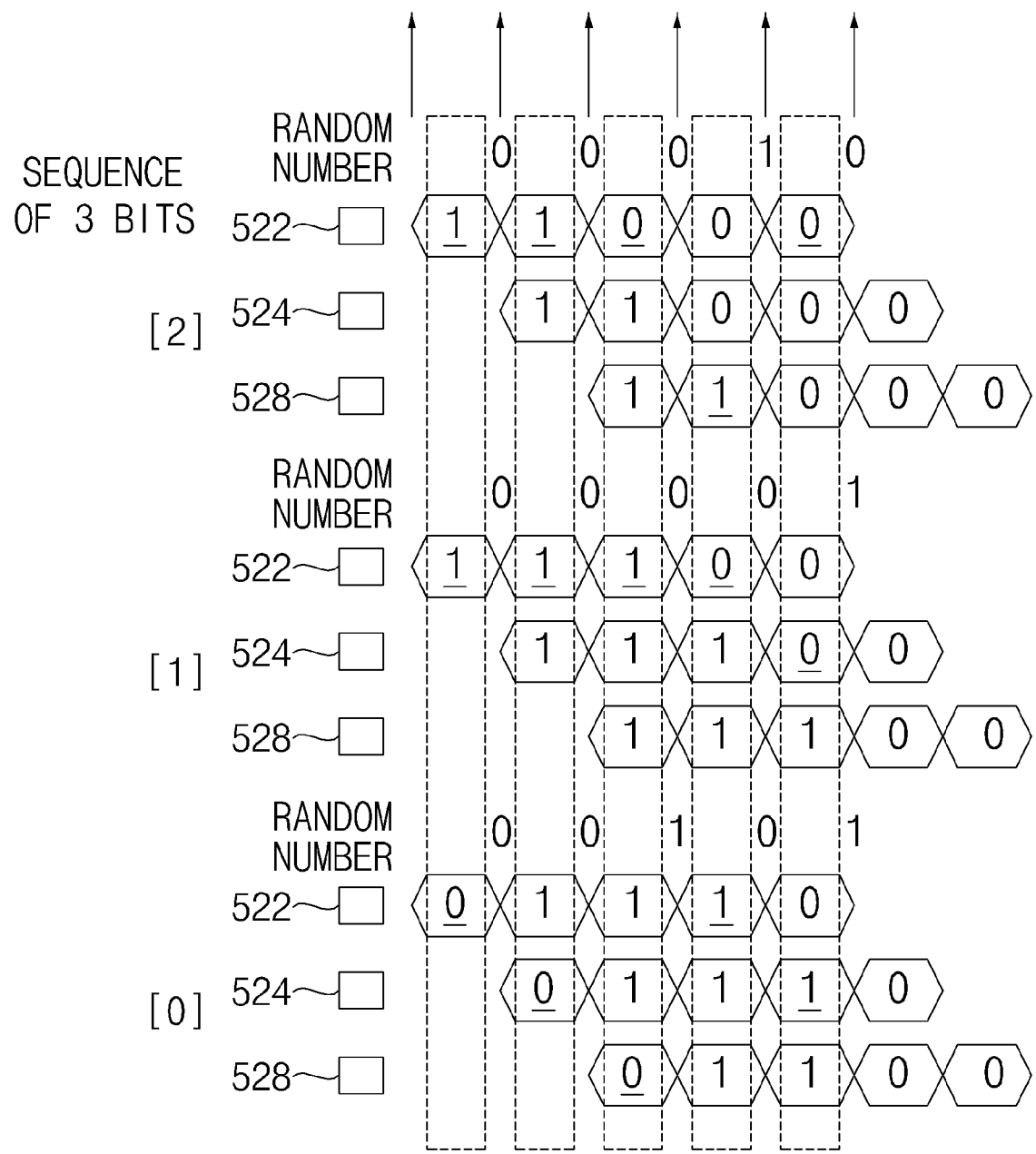

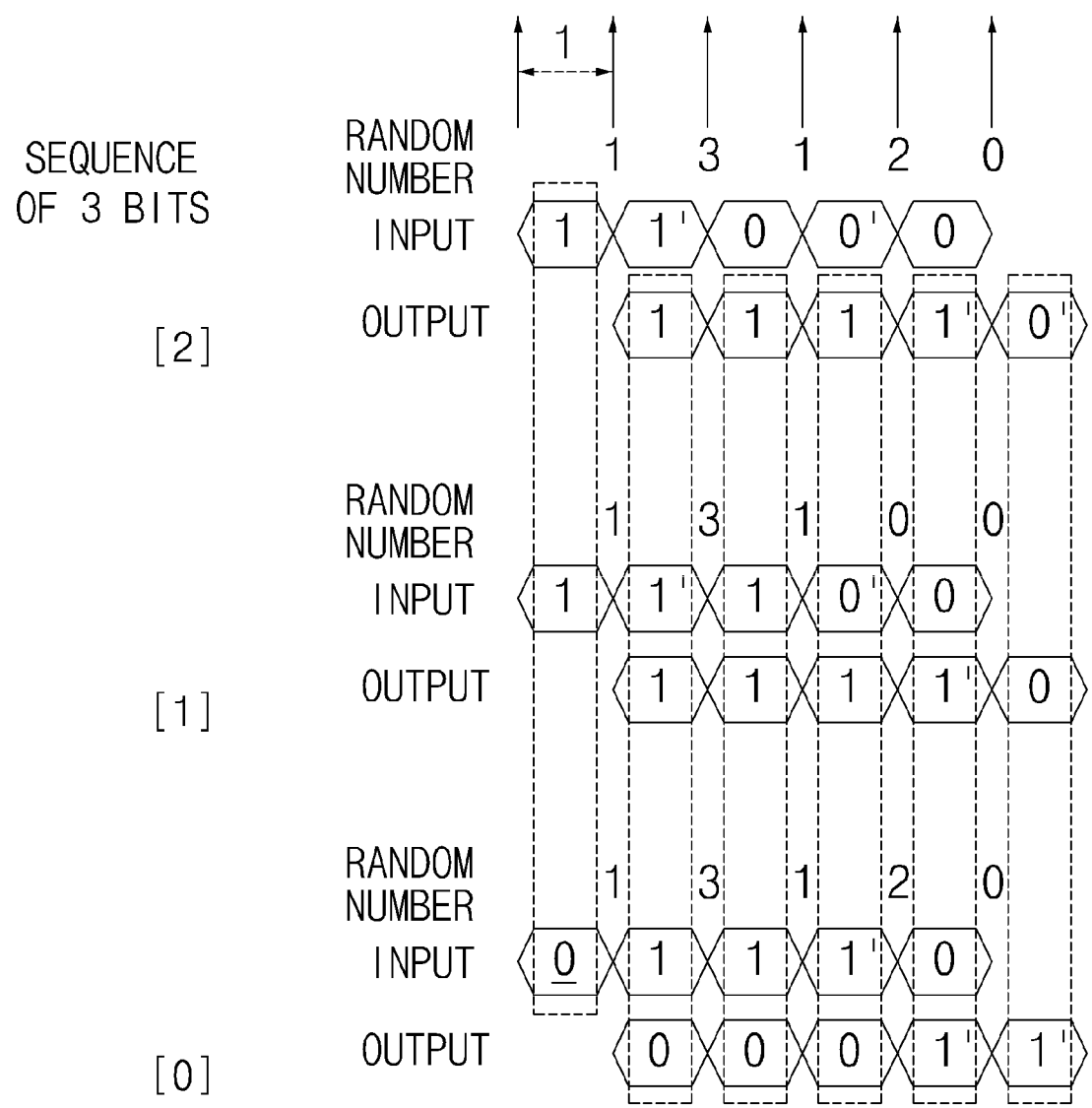

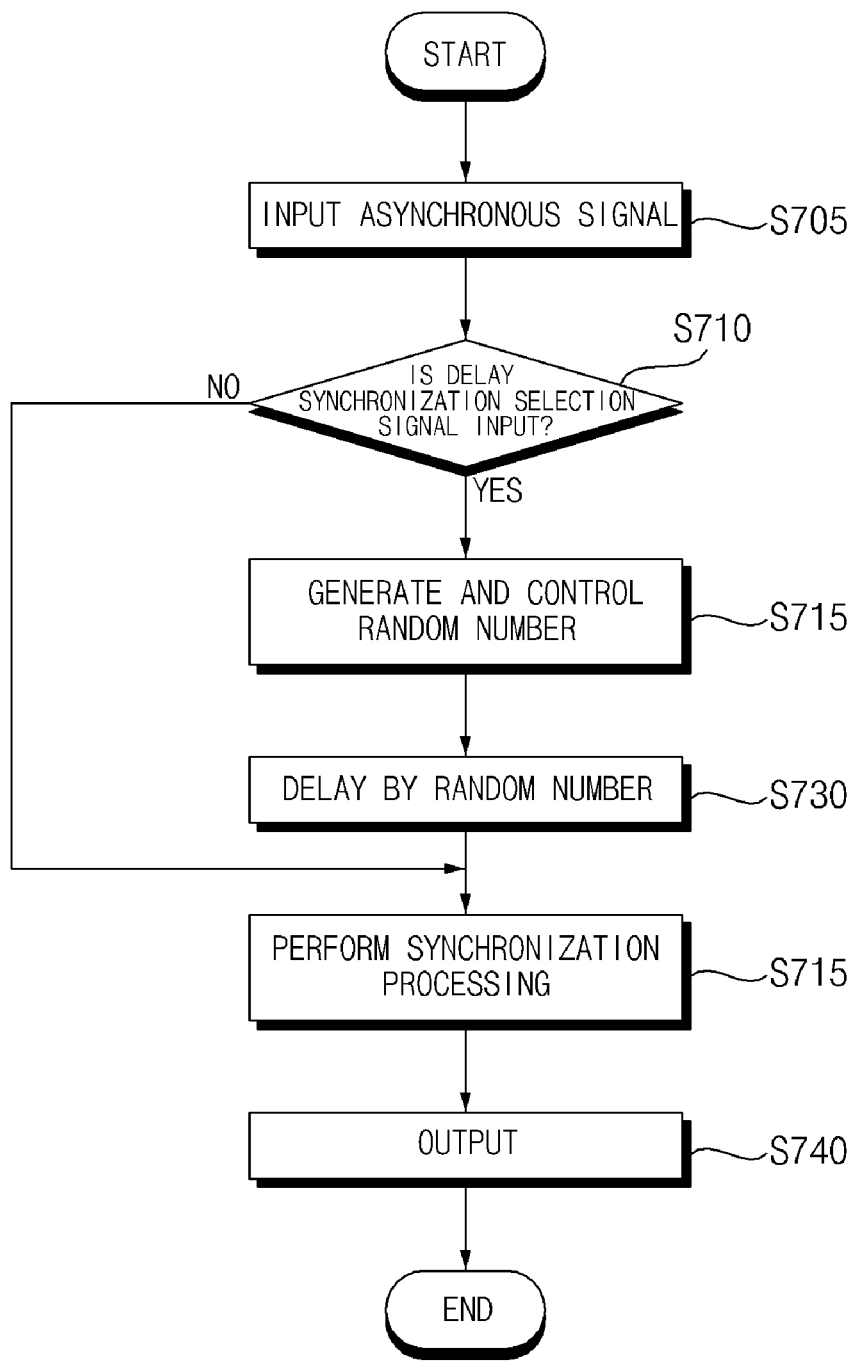

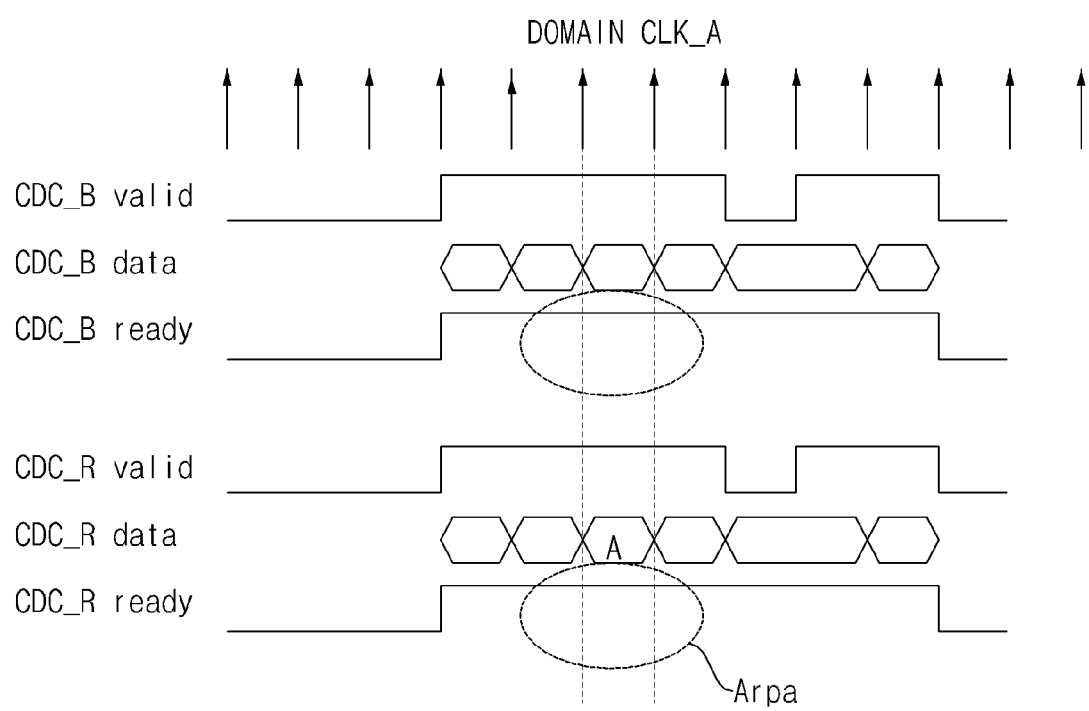

DELAY SYNCHRONIZATION PROCESSING DEVICE AND SIGNAL PROCESSING DEVICE INCLUDING SAME

CROSS REFERENCE TO RELATED APPLICATIONS

This application is the National Phase of PCT/KR2020/012388 filed on Sep. 14, 2020, which is hereby expressly incorporated by reference into the present application.

BACKGROUND

1. Field

The present disclosure relates to a delay synchronization processing device and a signal processing device including the same, and more particularly to a delay synchronization processing device capable of detecting an error during processing of an asynchronous bit signal, and a signal processing device including the delay synchronization processing device.

2. Description of the Related Art

A signal processing device is a device for signal processing and a hardware device in which various circuit elements are integrated.

Meanwhile, in designing a first circuit and a second circuit in the signal processing device, a clock frequency of the first circuit may be asynchronous with a clock frequency of the second circuit, and a synchronization processing circuit is used in the second circuit so that the second circuit, having the clock frequency being asynchronous with respect to the clock frequency of the first circuit, may be synchronized.

A synchronization processing circuit according to a prior art includes three flip-flops and a switch.

In the synchronization processing circuit according to the prior art, input N-bit data is transmitted to a first flip-flop and a second flip-flop, and a result of the first flip-flop or a result of the second flip-flop is transmitted to a third flip-flop by a randomly selected switch.

As a result, some bits pass through the first flip-flop, and others pass through the first flip-flop and the second flip-flop, such that timings of some bits of the N-bit data are delayed relative to each other by one clock cycle, thereby causing a glitch.

Further, according to the prior art, the use of a plurality of flip-flops may cause an unwanted glitch even when a normal operation is to be performed.

SUMMARY

It is an objective of the present disclosure to provide a delay synchronization processing device capable of detecting an error during processing of an asynchronous bit signal, and a signal processing device including the delay synchronization processing device.

Meanwhile, it is another objective of the present disclosure to provide a delay synchronization processing device capable of detecting an error during processing of an asynchronous bit signal at the Register Transfer Level, and a signal processing device including the delay synchronization processing device.

Meanwhile, it is further another objective of the present disclosure to provide a delay synchronization processing device capable of delaying a variable number of clocks by using a delay device with a delay time that is not clock-dependent, and a signal processing device including the delay synchronization processing device.

In order to achieve the above objectives, a delay synchronization processing device according to an embodiment of the present disclosure includes: a delay device configured to generate a random number and to delay an input asynchronous N-bit signal based on the generated random number; and a synchronization processor configured to perform synchronization processing on the asynchronous N-bit signal delayed by the delay device.

Meanwhile, the delay device may be configured to delay each bit of the input asynchronous N-bit signal based on the generated random number and to output the delayed signal.

Meanwhile, the delay device may be configured to set a delay time for the each bit of the input asynchronous N-bit signal based on the generated random number, wherein the set delay time may be different for the each bit.

Meanwhile, the delay device may be configured to set a random number of the each bit of the input asynchronous N-bit signal to a multiple of a clock period.

Meanwhile, in response to the input asynchronous N-bit signal being a Gray code signal, the delay device may be configured to output a normal bit signal without bit error.

Meanwhile, the delay device may be configured to receive a random number generation control signal, and to generate the random number based on the random number generation control signal.

Meanwhile, based on the random number generation control signal, the delay device may be configured to generate the random number at varying intervals or to adjust a range for generating the random number.

Meanwhile, based on the random number generation control signal, the delay device may be configured to perform or not perform some of an operation of generating the random number.

Meanwhile, based on random seed information included in the random number generation control signal, the delay device may be configured to generate the random number.

Meanwhile, the delay synchronization processing device may further include: a second synchronization processor configured to perform synchronization processing on the input asynchronous N-bit signal; and a first switch, which in response to a delay synchronization selection signal, is configured to transmit the input asynchronous N-bit signal to the delay device or the second synchronization processor.

Meanwhile, the delay synchronization processing device may further include a second switch connected to an output terminal of the second synchronization processor and an output terminal of the synchronization processor, and configured to selectively output an output of the second synchronization processor or an output of the synchronization processor.

Meanwhile, the delay synchronization processing device may further include: a third switch configured to receive a clock signal and to selectively output the clock signal to the synchronization processor or the second synchronization processor; and a fourth switch configured to receive a reset signal and to selectively output the reset signal to the synchronization processor or the second synchronization processor.

Meanwhile, the synchronization processor may include: a first flip-flop; a second flip-flop connected to an output terminal of the first flip-flop; and a fifth switch connected to the output terminal of the first flip-flop and an output terminal of the second flip-flop, and to selectively output an output of the first flip-flop or an output of the second flip-flop.

Meanwhile, the delay synchronization processing device may further include a third flip-flop connected to an output terminal of the fifth switch.

In order to achieve the above objectives, a signal processing device according to an embodiment of the present disclosure includes: a first circuit configured to operate at a first clock frequency and to transmit the asynchronous N-bit signal; and a second circuit configured to operate at a second clock frequency, which is different from the first clock frequency, and to receive the asynchronous N-bit signal from the first circuit, wherein the delay synchronization processing device is located at a front end of the second circuit.

Meanwhile, the first circuit may include: a data transmitter configured to transmit the asynchronous N-bit signal to the second circuit; a request signal generator configured to generate a request signal; and a second delay synchronization processing device configured to perform delay and synchronization processing on the request signal.

Meanwhile, the second circuit may include: a data receiver configured to receive the asynchronous N-bit signal from the first circuit; an acknowledge (ACK) signal configured to generate an ACK signal; and a third delay synchronization processing device configured to perform delay and synchronization processing on the ACK signal.

Effects of the Disclosure

A delay synchronization processing device and a signal processing device including the same according to an embodiment of the present disclosure include: a delay device configured to generate a random number and to delay an input asynchronous N-bit signal based on the generated random number; and a synchronization processor configured to perform synchronization processing on the asynchronous N-bit signal delayed by the delay device. Accordingly, an error during processing of the asynchronous bit signal may be detected. Particularly, an error may be detected during processing of the asynchronous bit signal at the Register Transfer Level. Further, a variable number of clocks may be delayed by using the delay device with a delay time that is not clock-dependent.

Meanwhile, the delay device may be configured to delay each bit of the input asynchronous N-bit signal based on the generated random number and to output the delayed signal. Accordingly, an error during processing of the asynchronous bit signal may be detected.

Meanwhile, the delay device may be configured to set a delay time for the each bit of the input asynchronous N-bit signal based on the generated random number, wherein the set delay time may be different for the each bit. Accordingly, an error during processing of the asynchronous bit signal may be detected.

Meanwhile, the delay device may be configured to set a random number of the each bit of the input asynchronous N-bit signal to a multiple of a clock period. Accordingly, an error during processing of the asynchronous bit signal may be detected.

Meanwhile, in response to the input asynchronous N-bit signal being a Gray code signal, the delay device may be configured to output a normal bit signal without bit error. Accordingly, an error during processing of the asynchronous bit signal may be detected.

Meanwhile, the delay device may be configured to receive a random number generation control signal, and to generate the random number based on the random number generation control signal. Accordingly, an error during processing of the asynchronous bit signal may be detected.

Meanwhile, based on the random number generation control signal, the delay device may be configured to generate the random number at varying intervals or to adjust a range for generating the random number. Accordingly, an error during processing of the asynchronous bit signal may be detected.

Meanwhile, based on the random number generation control signal, the delay device may be configured to perform or not perform some of an operation of generating the random number. Accordingly, an error during processing of the asynchronous bit signal may be detected.

Meanwhile, based on random seed information included in the random number generation control signal, the delay device may be configured to generate the random number. Accordingly, an error during processing of the asynchronous bit signal may be detected.

Meanwhile, the delay synchronization processing device may further include: a second synchronization processor configured to perform synchronization processing on the input asynchronous N-bit signal; and a first switch, which in response to a delay synchronization selection signal, is configured to transmit the input asynchronous N-bit signal to the delay device or the second synchronization processor. Thus, the second synchronization processor or the delay device may be selectively operated. Accordingly, an error during processing of the asynchronous bit signal may be detected.

Meanwhile, the delay synchronization processing device may further include a second switch connected to an output terminal of the second synchronization processor and an output terminal of the synchronization processor, and configured to selectively output an output of the second synchronization processor or an output of the synchronization processor. Thus, the second synchronization processor or the synchronization processor may be selectively operated. Accordingly, an error during processing of the asynchronous bit signal may be detected.

Meanwhile, the delay synchronization processing device may further include: a third switch configured to receive a clock signal and to selectively output the clock signal to the synchronization processor or the second synchronization processor; and a fourth switch configured to receive a reset signal and to selectively output the reset signal to the synchronization processor or the second synchronization processor. Thus, the delay synchronization processing device may operate based on the clock signal or the reset signal. Accordingly, an error during processing of the asynchronous bit signal may be detected.

Meanwhile, the synchronization processor may include: a first flip-flop; a second flip-flop connected to an output terminal of the first flip-flop; and a fifth switch connected to the output terminal of the first flip-flop and an output terminal of the second flip-flop, and to selectively output an output of the first flip-flop or an output of the second flip-flop. Accordingly, synchronization processing may be performed on the asynchronous N-bit signal.

Meanwhile, the delay synchronization processing device may further include a third flip-flop connected to an output terminal of the fifth switch. Accordingly, synchronization processing may be performed on the asynchronous N-bit signal.

In order to achieve the above objectives, a signal processing device according to an embodiment of the present disclosure includes: a first circuit configured to operate at a first clock frequency and to transmit the asynchronous N-bit signal; and a second circuit configured to operate at a second clock frequency, which is different from the first clock frequency, and to receive the asynchronous N-bit signal from the first circuit, wherein the delay synchronization processing device is located at a front end of the second circuit. Thus, delay and synchronization between the first circuit and the second circuit may be performed. As a result, an error during processing of the asynchronous bit signal may be detected.

Meanwhile, the first circuit may include: a data transmitter configured to transmit the asynchronous N-bit signal to the second circuit; a request signal generator configured to generate a request signal; and a second delay synchronization processing device configured to perform delay and synchronization processing on the request signal. Accordingly, an error during transmission of the request signal may be detected.

Meanwhile, the second circuit may include: a data receiver configured to receive the asynchronous N-bit signal from the first circuit; an acknowledge (ACK) signal configured to generate an ACK signal; and a third delay synchronization processing device configured to perform delay and synchronization processing on the ACK signal. Accordingly, an error during transmission of the ACK signal may be detected.

BRIEF DESCRIPTION OF THE DRAWINGS

FIGS. 5A and 5B are diagrams referred to in the description of a synchronization processing device associated with the present disclosure.

FIG. 6B is a diagram referred to in the description of the operation of FIG. 6A.

FIG. 7 is an example of a flowchart of operation of a delay synchronization processing device according to an embodiment of the present disclosure.

DETAILED DESCRIPTION OF THE PREFERRED EMBODIMENTS

Hereinafter, the present disclosure will be described in detail with reference to the accompanying drawings.

Regarding constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
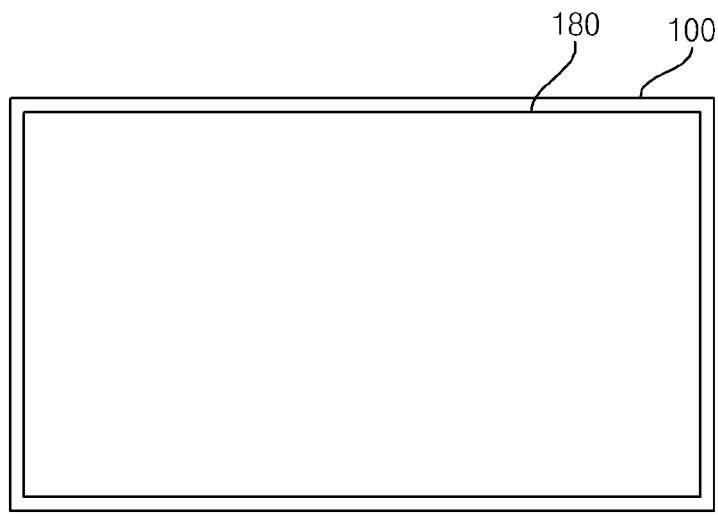
FIG. 1 is a diagram showing an image display apparatus according to an embodiment of the present disclosure.

FIG. 1 is a diagram showing an image display apparatus according to an embodiment of the present disclosure.

Referring to the figure, an image display apparatus 100 may include a display 180.

The image display apparatus 100 may receive image signals from various external devices, process the image signals and display the processed image signals on the display 180.

The various external devices may be, for example, a mobile terminal 600 such as a computer (PC) or a smartphone, a set-top box (STB), a game console (GSB), a server (SVR), and the like.

The display 180 may be implemented as one of various panels. For example, the display 180 may be any one of spontaneous emission panels such as an organic light emitting diode panel (OLED panel), an inorganic LED panel, and a micro LED panel.

Meanwhile, the image display apparatus 100 of FIG. 1 may be a TV receiver, a monitor, a tablet, a mobile terminal, a vehicle display device, or the like.

Figure 2:
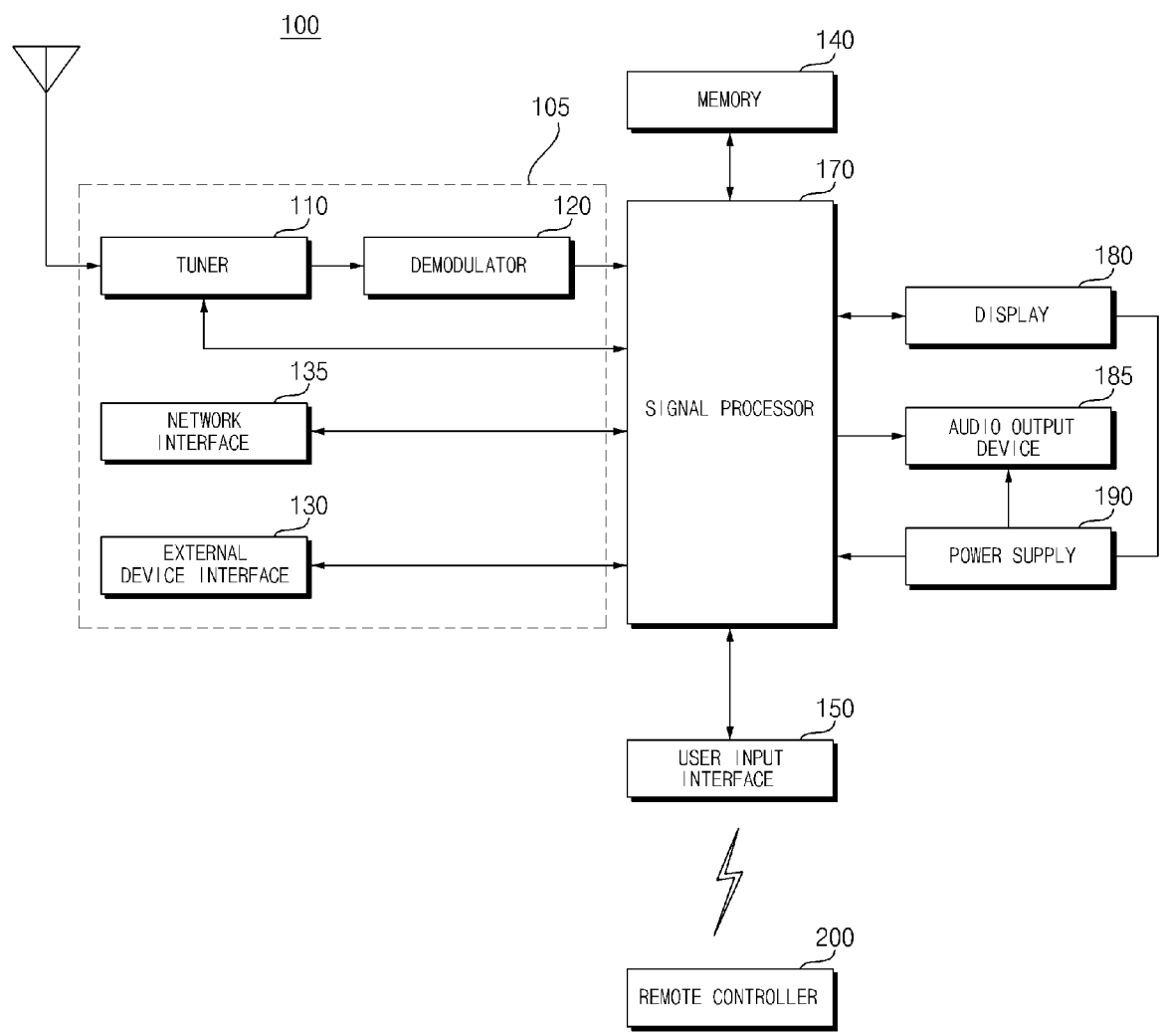
FIG. 2 is an example of an internal block diagram of the image display apparatus.

FIG. 2 is an example of an internal block diagram of the image display apparatus of FIG. 1.

Referring to FIG. 2, the image display apparatus 100 according to an embodiment of the present disclosure includes an image receiver 105, an external apparatus interface 130, a memory 140, a user input interface 150, a sensor device (not shown), a signal processor 170, a display 180, and an audio output device 185.

The image receiver 105 may include a tuner 110, a demodulator 120, a network interface 135, and an external apparatus interface 130.

Meanwhile, unlike the figure, the image receiver 105 may include only the tuner 110, the demodulator 120, and the external apparatus interface 130. That is, the network interface 135 may not be included.

The tuner 110 selects an RF broadcast signal corresponding to a channel selected by a user or all pre-stored channels among radio frequency (RF) broadcast signals received through an antenna (not shown). In addition, the selected RF broadcast signal is converted into an intermediate frequency signal, a baseband image, or an audio signal.

Meanwhile, the tuner 110 may include a plurality of tuners for receiving broadcast signals of a plurality of channels. Alternatively, a single tuner that simultaneously receives broadcast signals of a plurality of channels is also available.

The demodulator 120 receives the converted digital IF signal DIF from the tuner 110 and performs a demodulation operation.

The demodulator 120 may perform demodulation and channel decoding and then output a stream signal TS. At this time, the stream signal may be a multiplexed signal of an image signal, an audio signal, or a data signal.

The stream signal output from the demodulator 120 may be input to the signal processor 170. The signal processor 170 performs demultiplexing, image/audio signal processing, and the like, and then outputs an image to the display 180 and outputs audio to the audio output device 185.

The external apparatus interface 130 may transmit or receive data with a connected external apparatus (not shown), e.g., a set-top box STB. To this end, the external apparatus interface 130 may include an A/V input and output device (not shown).

The external apparatus interface 130 may be connected in wired or wirelessly to an external apparatus such as a digital versatile disk (DVD), a Blu ray, a game equipment, a camera, a camcorder, a computer (note book), and a set-top box, and may perform an input/output operation with an external apparatus.

The A/V input and output device may receive image and audio signals from an external apparatus. Meanwhile, a wireless transceiver (not shown) may perform short-range wireless communication with other electronic apparatus.

Through the wireless transceiver (not shown), the external apparatus interface 130 may exchange data with an adjacent mobile terminal 600. In particular, in a mirroring mode, the external apparatus interface 130 may receive device information, executed application information, application image, and the like from the mobile terminal 600.

The network interface 135 provides an interface for connecting the image display apparatus 100 to a wired/wireless network including the Internet network. For example, the network interface 135 may receive, via the network, content or data provided by the Internet, a content provider, or a network operator.

Meanwhile, the network interface 135 may include a wireless transceiver (not shown).

The memory 140 may store a program for each signal processing and control in the signal processor 170, and may store signal-processed image, audio, or data signal.

In addition, the memory 140 may serve to temporarily store image, audio, or data signal input to the external apparatus interface 130. In addition, the memory 140 may store information on a certain broadcast channel through a channel memory function such as a channel map.

Although FIG. 2 illustrates that the memory is provided separately from the signal processor 170, the scope of the present disclosure is not limited thereto. The memory 140 may be included in the signal processor 170.

The user input interface 150 transmits a signal input by the user to the signal processor 170 or transmits a signal from the signal processor 170 to the user.

For example, it may transmit/receive a user input signal such as power on/off, channel selection, screen setting, etc., from a remote controller 200, may transfer a user input signal input from a local key (not shown) such as a power key, a channel key, a volume key, a set value, etc., to the signal processor 170, may transfer a user input signal input from a sensor device (not shown) that senses a user's gesture to the signal processor 170, or may transmit a signal from the signal processor 170 to the sensor device (not shown).

The signal processor 170 may demultiplex the input stream through the tuner 110, the demodulator 120, the network interface 135, or the external apparatus interface 130, or process the demultiplexed signals to generate and output a signal for image or audio output.

For example, the signal processor 170 receives a broadcast signal received by the image receiver 105 or an HDMI signal, and perform signal processing based on the received broadcast signal or the HDMI signal to thereby output a processed image signal.

The image signal processed by the signal processor 170 is input to the display 180, and may be displayed as an image corresponding to the image signal. In addition, the image signal processed by the signal processor 170 may be input to the external output apparatus through the external apparatus interface 130.

The audio signal processed by the signal processor 170 may be output to the audio output device 185 as an audio signal. In addition, audio signal processed by the signal processor 170 may be input to the external output apparatus through the external apparatus interface 130.

Although not shown in FIG. 2, the signal processor 170 may include a demultiplexer, an image processor, and the like. That is, the signal processor 170 may perform a variety of signal processing and thus it may be implemented in the form of a system on chip (SOC). This will be described later with reference to FIG. 3.

In addition, the signal processor 170 may control the overall operation of the image display apparatus 100. For example, the signal processor 170 may control the tuner 110 to control the tuning of the RF broadcast corresponding to the channel selected by the user or the previously stored channel.

In addition, the signal processor 170 may control the image display apparatus 100 according to a user command input through the user input interface 150 or an internal program.

Meanwhile, the signal processor 170 may control the display 180 to display an image. At this time, the image displayed on the display 180 may be a still image or a moving image, and may be a 2D image or a 3D image.

Meanwhile, the signal processor 170 may display a certain object in an image displayed on the display 180. For example, the object may be at least one of a connected web screen (newspaper, magazine, etc.), an electronic program guide (EPG), various menus, a widget, an icon, a still image, a moving image, and a text.

Meanwhile, the signal processor 170 may recognize the position of the user based on the image photographed by a photographing device (not shown). For example, the distance (z-axis coordinate) between a user and the image display apparatus 100 may be determined. In addition, the x-axis coordinate and the y-axis coordinate in the display 180 corresponding to a user position may be determined.

The display 180 generates a driving signal by converting an image signal, a data signal, an OSD signal, a control signal processed by the signal processor 170, an image signal, a data signal, a control signal, and the like received from the external apparatus interface 130.

Meanwhile, the display 180 may be configured as a touch screen and used as an input device in addition to an output device.

The audio output device 185 receives a signal processed by the signal processor 170 and outputs it as an audio.

The photographing device (not shown) photographs a user. The photographing device (not shown) may be implemented by a single camera, but the present disclosure is not limited thereto and may be implemented by a plurality of cameras. Image information photographed by the photographing device (not shown) may be input to the signal processor 170.

The signal processor 170 may sense a gesture of the user based on each of the images photographed by the photographing device (not shown), the signals detected from the sensor device (not shown), or a combination thereof.

The power supply 190 supplies corresponding power to the image display apparatus 100. Particularly, the power may be supplied to a signal processor 170 which may be implemented in the form of a system on chip (SOC), a display 180 for displaying an image, and an audio output device 185 for outputting an audio.

Specifically, the power supply 190 may include a converter for converting an AC power into a DC power, and a DC/DC converter for converting the level of the DC power.

The remote controller 200 transmits the user input to the user input interface 150. To this end, the remote controller 200 may use Bluetooth, a radio frequency (RF) communication, an infrared (IR) communication, an Ultra Wideband (UWB), ZigBee, or the like. In addition, the remote controller 200 may receive the image, audio, or data signal output from the user input interface 150, and display it on the remote controller 200 or output it as an audio.

Meanwhile, the image display apparatus 100 may be a fixed or mobile digital broadcast receiver capable of receiving digital broadcast.

Meanwhile, a block diagram of the image display apparatus 100 shown in FIG. 2 is a block diagram for an embodiment of the present disclosure. Each component of the block diagram may be integrated, added, or omitted according to a specification of the image display apparatus 100 actually implemented. That is, two or more components may be combined into a single component as needed, or a single component may be divided into two or more components. The function performed in each block is described for the purpose of illustrating embodiments of the present disclosure, and specific operation and apparatus do not limit the scope of the present disclosure.

Figure 3:
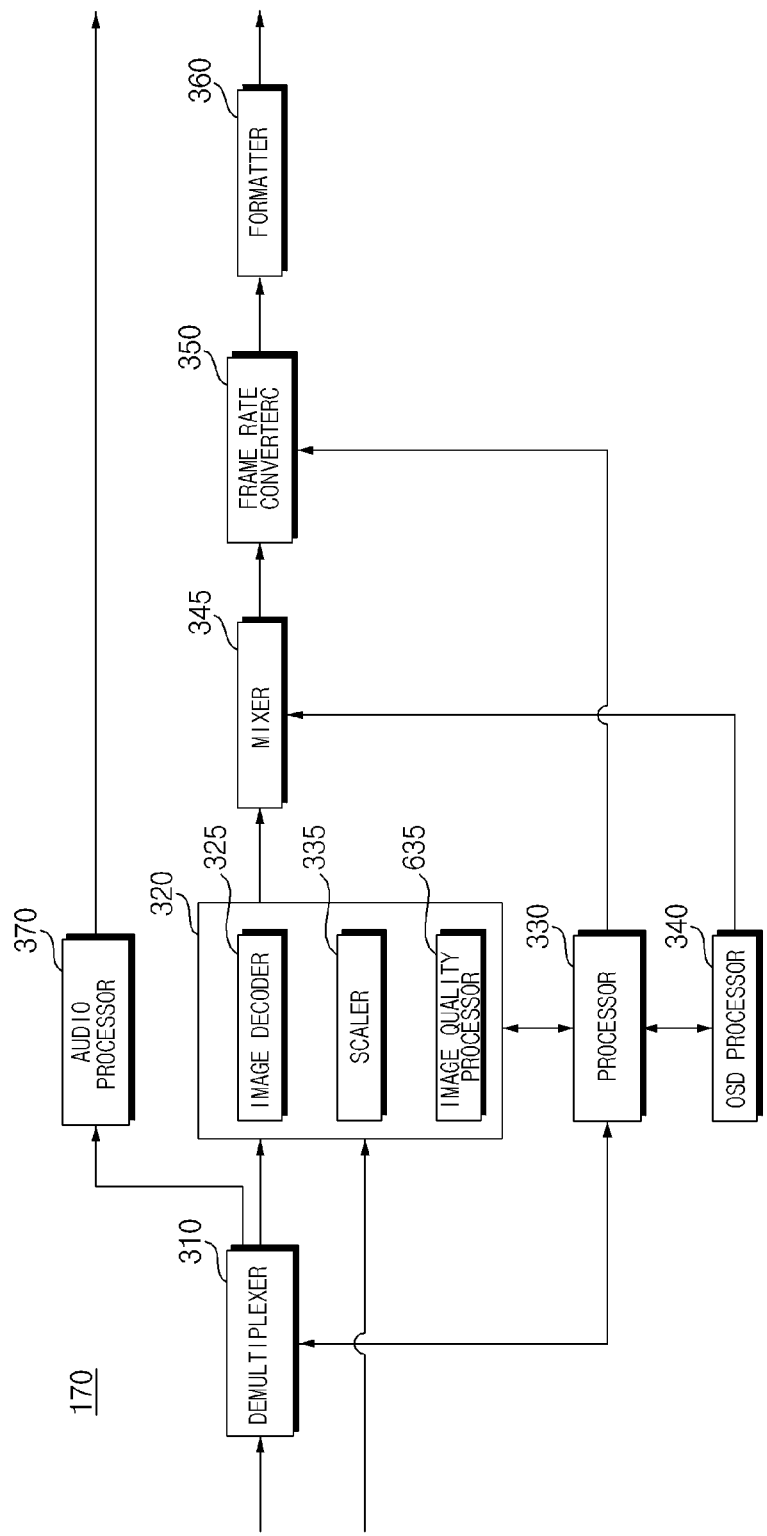
FIG. 3 is an example of an internal block diagram of a signal processor of FIG. 2.

FIG. 3 is an example of an internal block diagram of the signal processor in FIG. 2.

Referring to the figure, the signal processor 170 according to an embodiment of the present disclosure may include a demultiplexer 310, an image processor 320, a processor 330, and an audio processor 370. In addition, the signal processor 170 may further include and a data processor (not shown).

The demultiplexer 310 demultiplexes the input stream. For example, when an MPEG-2 TS is input, it may be demultiplexed into image, audio, and data signal, respectively. Here, the stream signal input to the demultiplexer 310 may be a stream signal output from the tuner 110, the demodulator 120, or the external apparatus interface 130.

The image processor 320 may perform signal processing on an input image. For example, the image processor 320 may perform image processing on an image signal demultiplexed by the demultiplexer 310.

To this end, the image processor 320 may include an image decoder 325, a scaler 335, an image quality processor 635, an image encoder (not shown), an OSD processor 340, a frame rate converter 350, a formatter 360, etc.

The image decoder 325 decodes a demultiplexed image signal, and the scaler 335 performs scaling so that the resolution of the decoded image signal may be output from the display 180.

The image decoder 325 may include a decoder of various standards. For example, a 3D image decoder for MPEG-2, H.264 decoder, a color image, and a depth image, and a decoder for a multiple view image may be provided.

The scaler 335 may scale an input image signal decoded by the image decoder 325 or the like.

For example, if the size or resolution of an input image signal is small, the scaler 335 may upscale the input image signal, and, if the size or resolution of the input image signal is great, the scaler 335 may downscale the input image signal.

The image quality processor 635 may perform image quality processing on an input image signal decoded by the image decoder 325 or the like.

For example, the image quality processor 625 may perform noise reduction processing on an input image signal, extend a resolution of high gray level of the input image signal, perform image resolution enhancement, perform high dynamic range (HDR)-based signal processing, change a frame rate, perform image quality processing suitable for properties of a panel, especially an OLED panel, etc.

The OSD processor 340 generates an OSD signal according to a user input or by itself. For example, based on a user input signal, the OSD processor 340 may generate a signal for displaying various information as a graphic or a text on the screen of the display 180. The generated OSD signal may include various data such as a user interface screen of the image display apparatus 100, various menu screens, a widget, and an icon. In addition, the generated OSD signal may include a 2D object or a 3D object.

In addition, the OSD processor 340 may generate a pointer that may be displayed on the display, based on a pointing signal input from the remote controller 200. In particular, such a pointer may be generated by a pointing signal processor, and the OSD processor 340 may include such a pointing signal processor (not shown). Obviously, the pointing signal processor (not shown) may be provided separately from the OSD processor 340.

The frame rate converter (FRC) 350 may convert a frame rate of an input image. Meanwhile, the frame rate converter 350 may output the input image without converting the frame rate.

Meanwhile, the formatter 360 may change a format of an input image signal into a format suitable for displaying the image signal on a display and output the image signal in the changed format.

In particular, the formatter 360 may change a format of an image signal to correspond to a display panel.

The processor 330 may control overall operations of the image display apparatus 100 or the signal processor 170.

For example, the processor 330 may control the tuner 110 to control the tuning of an RF broadcast corresponding to a channel selected by a user or a previously stored channel.

In addition, the processor 330 may control the image display apparatus 100 according to a user command input through the user input interface 150 or an internal program.

In addition, the processor 330 may transmit data to the network interface 135 or to the external apparatus interface 130.

In addition, the processor 330 may control the demultiplexer 310, the image processor 320, and the like in the signal processor 170.

Meanwhile, the audio processor 370 in the signal processor 170 may perform the audio processing of the demultiplexed audio signal. To this end, the audio processor 370 may include various decoders.

In addition, the audio processor 370 in the signal processor 170 may process a base, a treble, a volume control, and the like.

The data processor (not shown) in the signal processor 170 may perform data processing of the demultiplexed data signal. For example, when the demultiplexed data signal is a coded data signal, it may be decoded. The encoded data signal may be electronic program guide information including broadcast information such as a start time and an end time of a broadcast program broadcasted on each channel.

Meanwhile, a block diagram of the signal processor 170 shown in FIG. 3 is a block diagram for an embodiment of the present disclosure. Each component of the block diagram may be integrated, added, or omitted according to a specification of the signal processor 170 actually implemented.

In particular, the frame rate converter 350 and the formatter 360 may be provided separately in addition to the image processor 320.

Figure 4:
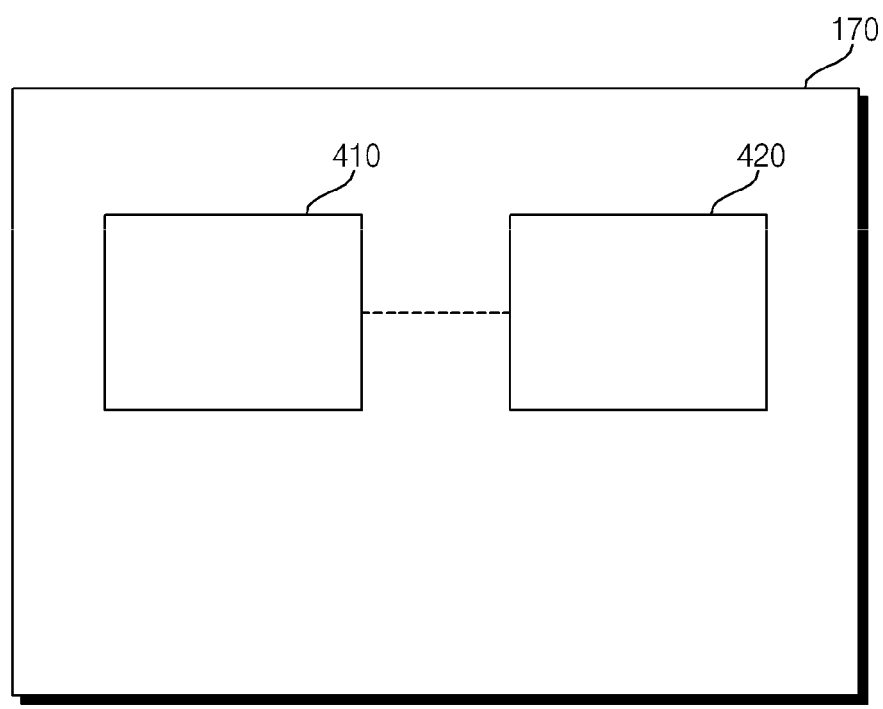
FIG. 4 is a diagram illustrating a first circuit and a second circuit in a signal processing device according to an embodiment of the present disclosure.

FIG. 4 is a diagram illustrating a first circuit and a second circuit in a signal processing device according to an embodiment of the present disclosure.

Referring to the drawing, a signal processing device 170 according to an embodiment of the present disclosure, which is implemented in the form of a system on chip (SOC), may include a first circuit 410 configured to operate at a first clock frequency and to transmit an asynchronous N-bit signal, and a second circuit 420 configured to operate at a second clock frequency, which is different from the first clock frequency, and to receive the asynchronous N-bit signal from the first circuit 410.

When the first circuit 410 and the second circuit 420 operate at different clock frequencies, it is necessary to synchronize asynchronous processing timings.

Particularly, when the signal processing device 170 is designed at Register Transfer Level (RTL), error checking may be performed by a verification device for RTL simulation.

Figure 6A:
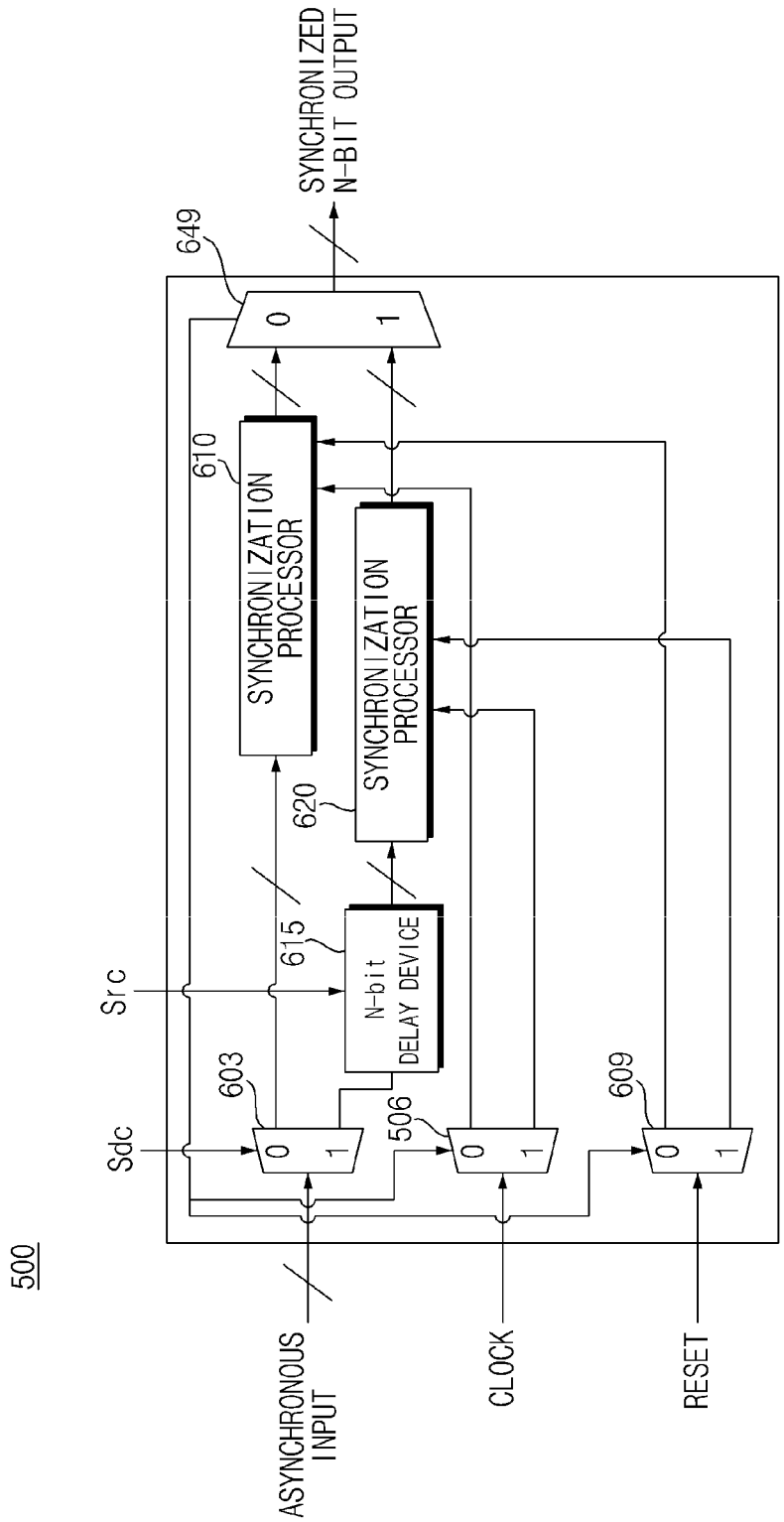
FIG. 6A is an example of an internal circuit diagram of a delay synchronization processing device according to an embodiment of the present disclosure.

Meanwhile, the verification device for RTL simulation may be included in a synchronization processing device 500x of FIG. 5A or in a delay synchronization processing device 500 of FIG. 6A.

FIGS. 5A and 5B are diagrams referred to in the description of a synchronization processing device associated with the present disclosure.

First, FIG. 5A is an example of an internal circuit diagram of a synchronization processing device associated with the present disclosure.

Referring to the drawing, the synchronization processing device 500x of FIG. 5A may include a first synchronization processor 520, a second synchronization processor 510, a switch 503 configured to output an asynchronous input signal to the first synchronization processor 520 or the second synchronization processor 510 in response to a selection signal Scx, a switch 549 configured to select an output of the first synchronization processor 520 or the second synchronization processor 510, a clock signal switch 506, and a reset signal switch 509.

If a level of the selection signal Scx is a high level or "1," the asynchronous input signal may be transmitted to the second synchronization processor 510, and if a level of the selection signal Scx is a low level or "0," the asynchronous input signal may be transmitted to the first synchronization processor 510.

The first synchronization processor 520 may include a first flip-flop 522, a second flip-flop 524 connected to an output terminal of the first flip-flop 522, and a switch 527 connected to the output terminal of the first flip-flop 522 and an output terminal of the second flip-flop 524 and configured to selectively output an output of the first flip-flop 522 or an output of the second flip-flop 524.

The switch 527 may selectively output the output of the first flip-flop 522 or the output of the second flip-flop 524 in response to an input selection signal Scy.

Meanwhile, the first synchronization processor 520 may further include a third flip-flop 528 connected to an output terminal of the switch 527.

Meanwhile, the first synchronization processor 520 may operate as a verification device for RTL simulation.

For example, if an asynchronous input signal is N-bit data, the input N-bit data is transmitted to the first flip-flop 522 and the second flip-flop 524, and may be transmitted to the third flip-flop 528 by using a randomly selected switch.

As a result, some bits pass through only the first flip-flop 522, and others pass through the first flip-flop 522 and the second flip-flop 524, such that bit timings of N-bit data, having passed through the third flip-flop 528, are delayed relative to each other by one clock cycle, thereby causing a glitch.

FIG. 5B is a diagram referred to in the description of operation of the first synchronization processor 520.

Particularly, FIG. 5B illustrates operation of the first flip-flop 522, the second flip-flop 524, and the third flip-flop 528 in the first synchronization processor 520 when 3-bit data are successively transmitted from an external source.

Referring to the drawing, when an external transmitter (not shown) sequentially transmits the 3-bit data of "000," "001," "011," "111," and "110," random numbers of the respective bits are set regardless of the bits, and the first flip-flop 522, the second flip-flop 524, and the third flip-flop 528 may operate as illustrated in the drawing.

Accordingly, an output terminal of the synchronization processor 520 may sequentially output the 3-bit data of "001," "101," "010," "110," and "110." In this case, a glitch occurs in "101" and "010" among the output data.

Meanwhile, in the RTL simulation, there should be no distortion in Gray code transmission, but the Gray code may be distorted by the glitch.

Accordingly, even when an actual circuit structure is normal, malfunction may be detected in the RTL simulation.

It is required to add several flip-flops (F/F) in order to remove the glitch, but in this case, an unwanted glitch may occur even when a normal operation is to be performed.

Accordingly, the present disclosure proposes a delay synchronization processing device capable of delaying a variable number of clocks by using a delay device with a delay time that is not clock-dependent, which will be described below with reference to FIG. 6A and the following figures.

FIG. 6A is an example of an internal circuit diagram of a delay synchronization processing device according to an embodiment of the present disclosure.

Referring to the drawing, the delay synchronization processing device 500 according to an embodiment of the present disclosure may include a delay device 615 configured to generate a random number and to delay an input asynchronous N-bit signal based on the generated random number, and a synchronization processor 620 configured to perform synchronization processing on the asynchronous N-bit signal delayed by the delay device 615.

Meanwhile, the delay device 615 may delay each bit of the input asynchronous N-bit signal based on the generated random number.

Accordingly, an error during processing of the asynchronous bit signal may be detected. Particularly, an error may be detected during processing of the asynchronous bit signal at the Register Transfer Level. Further, a variable number of clocks may be delayed by using the delay device with a delay time that is not clock-dependent.

Meanwhile, the delay device 615 may set a delay time of each bit of the input asynchronous N-bit signal based on the generated random number, and each delay time may be different for each bit. Alternatively, each delay time may be the same for each bit. Accordingly, an error during processing of the asynchronous bit signal may be detected.

Meanwhile, the delay device 615 may set the random number of each bit of the input asynchronous N-bit signal to a multiple of the clock period. Accordingly, an error during processing of the asynchronous bit signal may be detected.

For example, in response to an input of an asynchronous 3-bit signal, the delay device 615 may set any one of 1 to 3 times the clock period.

In another example, in response to an input of an asynchronous 5-bit signal, the delay device 615 may set any one of 1 to 5 times the clock period.

That is, as the input asynchronous N-bit number increases, the delay device 615 may set the multiple of the clock period to various values, and may increase the multiple.

Meanwhile, if the input asynchronous N-bit signal is a Gray code signal, the delay device 615 may output a normal bit signal without bit error. Accordingly, an error during processing of the asynchronous bit signal may be detected.

Meanwhile, the delay device 615 may receive a random number generation control signal Src and may generate a random number based on the random number generation control signal Src. Accordingly, an error during processing of the asynchronous bit signal may be detected.

Meanwhile, based on the random number generation control signal Src, the delay device 615 may generate the random number at varying intervals or may adjust a range for generating the random number. Accordingly, an error during processing of the asynchronous bit signal may be detected.

Meanwhile, based on the random number generation control signal Src, the delay device 615 may perform or not perform some of the operation of generating the random number. Accordingly, an error during processing of the asynchronous bit signal may be detected.

Meanwhile, the delay device 615 may generate the random number based on random seed information included in the random number generation control signal Src. Accordingly, an error during processing of the asynchronous bit signal may be detected.

Meanwhile, the delay synchronization processing device 500 according to an embodiment of the present disclosure may further include a second synchronization processor 610 configured to perform synchronization processing on an input asynchronous N-bit signal, and a first switch 603 configured to transmit the input asynchronous N-bit signal to the delay device 615 or the second synchronization processor 610 in response to a delay synchronization selection signal Sdc. Thus, the second synchronization processor 610 or the delay device 615 may operate selectively. Accordingly, an error during processing of the asynchronous bit signal may be detected.

For example, if a level of the delay synchronization selection signal Sdc is a high level or "1," the asynchronous input signal may be transmitted to the delay device 510, and if a level of the delay synchronization selection signal Sdc is a low level or "0," the asynchronous input signal may be transmitted to the second synchronization processor 510.

Meanwhile, there is further included a second switch 649 connected to an output terminal of the second synchronization processor 610 and an output terminal of the synchronization processor 620 and configured to selectively output an output of the second synchronization processor 610 or an output of the synchronization processor 620. Accordingly, an error during processing of the asynchronous bit signal may be detected.

Meanwhile, the delay synchronization processing device 500 according to an embodiment of the present disclosure may further include a third switch 506 configured to receive a clock signal and to selectively output the clock signal to the synchronization processor 620 or the second synchronization processor 610, and a fourth switch 609 configured to receive a reset signal and to selectively output the reset signal to the synchronization processor 620 or the second synchronization processor 610. Accordingly, the delay synchronization processing device 500 may operate based on the clock signal or the reset signal, thereby detecting an error during processing of the asynchronous bit signal.

Meanwhile, the synchronization processor 620 may include the first flip-flop 522, the second flip-flop 524 connected to an output terminal of the first flip-flop 522, and a fifth switch 527 connected to the output terminal of the first flip-flop 522 and an output terminal of the second flip-flop 524 and configured to selectively output an output of the first flip-flop 522 or an output of the second flip-flop 524. Accordingly, the asynchronous N-bit signal may be delay synchronized.

The fifth switch 527 may selectively output the output of the first flip-flop 522 or the output of the second flip-flop 524 in response to the input selection signal Scy.

Meanwhile, the delay synchronization processing device 500 according to an embodiment of the present disclosure may further include the third flip-flop 528 connected to an output terminal of the fifth switch 527. Accordingly, synchronization processing may be performed on the asynchronous N-bit signal.

FIG. 6B is a diagram referred to in the description of the operation of FIG. 6A. Specifically, FIG. 6B is a diagram referred to in the description of the operation of the delay device 625.

Particularly, FIG. 6B illustrates the operation of the delay device 625 when 3-bit data are successively transmitted from an external source.

Referring to the drawing, when an external transmitter (not shown) sequentially transmits the 3-bit data of "000," "001," "011," "111," and "110," the delay device 625 may delay first to third clocks.

Particularly, the delay device 625 may set a random number of each bit to a multiple of the clock period. For example, the random number of each bit may be one time, two times, or three times the clock period.

Accordingly, the output terminal of the delay device 625 may sequentially output the 3-bit data of "001," "111," "110," "110," and "110." In this case, unlike FIG. 5B, a glitch does not occur.

Meanwhile, in the RTL simulation, distortion does not occur even during Gray-code transmission, such that if the actual circuit structure is a normal structure, operation may be detected as normal in the RTL simulation.

FIG. 7 is a flowchart of operation of a delay synchronization processing device according to an embodiment of the present disclosure.

Referring to the drawing, the delay synchronization processing device 500 receives an asynchronous signal (S705). For example, the first switch 530 in the delay synchronization processing device 500 may receive an asynchronous N-bit signal as the asynchronous signal.

Then, it is determined whether the delay synchronization selection signal Sdc is input to the delay synchronization processing device 500 (S710).

For example, if the delay synchronization selection signal Sdc is input to the first switch 530, and if a level of the delay synchronization selection signal Sdc is a high level or "1," operation 715 (S715) is performed.

That is, if the delay synchronization selection signal Sdc is input to the first switch 530, and if a level of the delay synchronization selection signal Sdc is a high level or "1," the first switch 530 transmits the asynchronous N-bit signal to the delay device 615.

In another example, if the delay synchronization selection signal Sdc is input to the first switch 530, and if a level of the delay synchronization selection signal Sdc is a low level or "0," operation 735 (S735) is performed.

That is, if the delay synchronization selection signal Sdc is input to the first switch 530, and if a level of the delay synchronization selection signal Sdc is a low level or "0," the first switch 530 transmits the asynchronous N-bit signal to the second synchronization processor 510.

Subsequently, if the delay synchronization selection signal Sdc is input to the first switch 530, and if a level of the delay synchronization selection signal Sdc is a high level or "1," the delay device 615 receives the random number generation control signal Src from an external source, and may generate and control the random number based on the random number generation control signal Src (S715).

Alternatively, if the delay synchronization selection signal Sdc is input to the first switch 530, and if a level of the delay synchronization selection signal Sdc is a high level or "1," the delay device 615 may generate the random number generation control signal Src including the random number.

Further, the delay device 615 may delay each bit of the input asynchronous N-bit signal based on the generated random number and may output the delayed signal (S730).

Meanwhile, the delay device 615 may delay each bit of the input asynchronous N-bit signal by a unit time based on the generated random number, and may repeatedly delay each bit of the signal by the unit time until the generated random number is reached.

Accordingly, each bit of the input asynchronous N-bit signal may be delayed and output.

For example, based on the random number generation control signal Src, the delay device 615 may generate the random number at varying intervals, or may adjust a range for generating the random number.

Meanwhile, the delay device 615 may set a random number of each bit of the input asynchronous N-bit signal to a multiple of the clock period, thereby detecting an error during processing of the asynchronous bit signal.

Then, the delayed asynchronous bit signal, output by the delay device 615, is input to the synchronization processor 620.

The synchronization processor 620 may perform synchronization processing (S735).

For example, the synchronization processor 620 may receive the delayed asynchronous bit signal from the delay device 615, and may perform synchronization processing on the delayed asynchronous bit signal.

Meanwhile, the synchronization processor 620 may include the first flip-flop 522, the second flip-flop 524 connected to an output terminal of the first flip-flop 522, the fifth switch 527 connected to the output terminal of the first flip-flop 522 and an output terminal of the second flip-flop 524 and configured to selectively output an output of the first flip-flop 522 or an output of the second flip-flop 524, and the third flip-flop 528 connected to an output terminal of the fifth switch 527. Accordingly, synchronization processing may be performed on the asynchronous N-bit signal.

The fifth switch 527 may selectively output the output of the first flip-flop 522 or the output of the second flip-flop 524 in response to the input selection signal Scy.

Accordingly, an error during processing of the asynchronous bit signal may be detected. Particularly, an error may be detected during processing of the asynchronous bit signal at the Register Transfer Level. Further, a variable number of clocks may be delayed by using the delay device with a delay time that is not clock-dependent.

In another example, in response to operation 710 (S710), the synchronization processor 620 may receive an asynchronous N-bit signal from the first switch 603 and may perform synchronization processing on the asynchronous N-bit signal. A description of the synchronization processing may be the same as the description of FIG. 5A or FIG. 6A.

FIGS. 8 to 13C are diagrams referred to in the description of the operation of FIG. 7.

Figure 8:
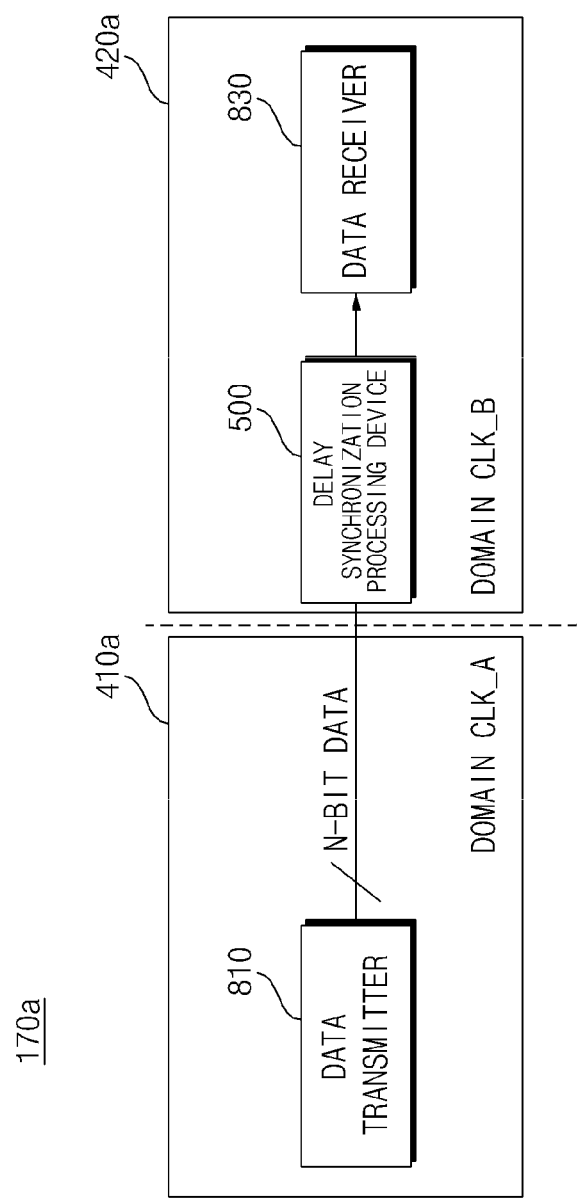
FIGS. 8 to 13C are diagrams referred to in the description of the operation of FIG. 7.

FIG. 8 is a diagram illustrating an example of a signal processing device according to an embodiment of the present disclosure.

Referring to the drawing, a signal processing device 170a according to an embodiment of the present disclosure may include a first circuit 410a configured to operate at a first clock frequency (e.g., CLK_x) and to transmit an asynchronous N-bit signal, and a second circuit 420a configured to operate at a second clock frequency (e.g., CLK_B), which is different from the first clock frequency, and to receive the asynchronous N-bit signal from the first circuit 410a.

Meanwhile, the first circuit 410a may include a data transmitter 810 configured to transmit the asynchronous N-bit signal to the second circuit 420a.

Meanwhile, the second circuit 420a may include a data receiver 830 configured to receive the asynchronous N-bit signal from the first circuit 410a.

Meanwhile, the second circuit 420a may include the delay synchronization processing device 500, described above with reference to FIGS. 6A to 7, for detecting an error and the like upon receiving the asynchronous N-bit signal.

As described above, the delay synchronization processing device 500 may include the delay device 615 configured to generate a random number and to delay an input asynchronous N-bit signal based on the generated random number, the synchronization processor 620 configured to perform synchronization processing on the asynchronous N-bit signal delayed by the delay device 615, and the like.

Accordingly, an error may be detected between the first circuit 410a and the second circuit 420a which operate at different clock frequencies.

Figure 9:
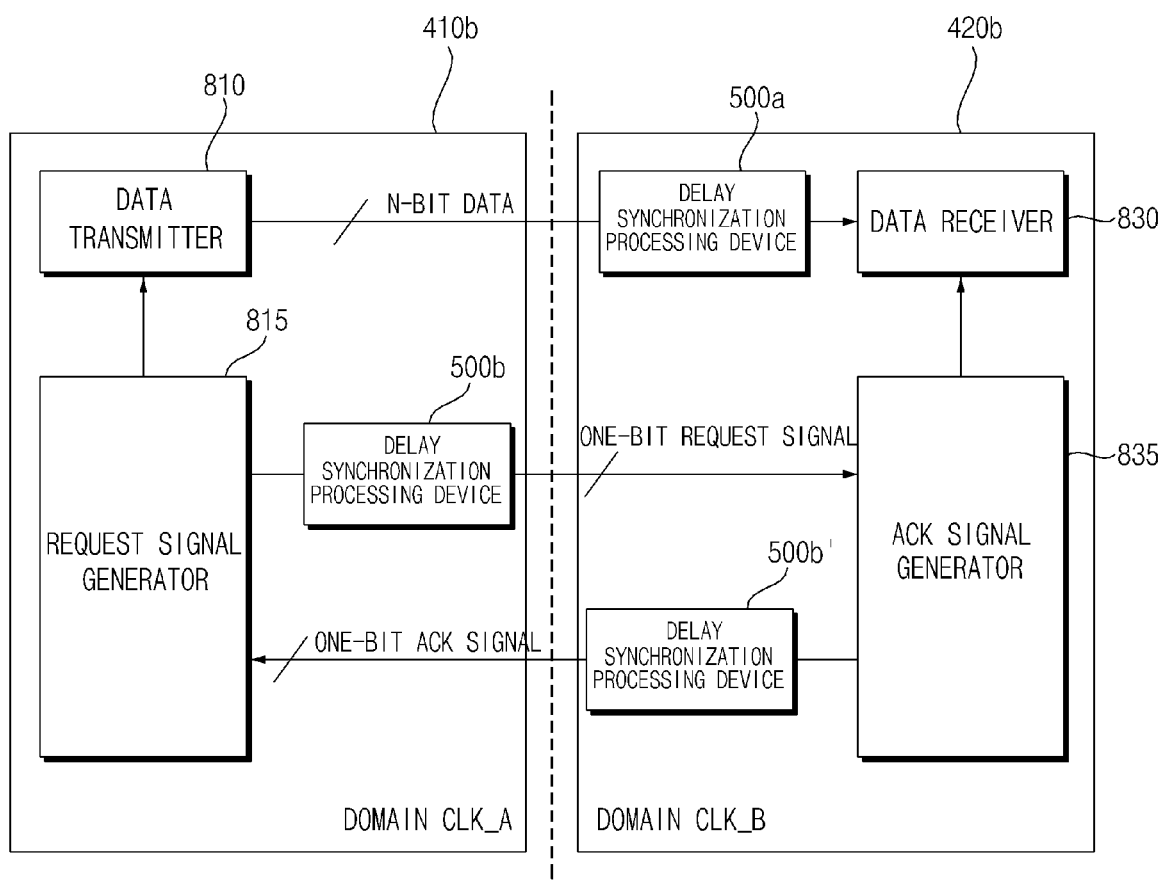

FIG. 9 is a diagram illustrating another example of a signal processing device according to an embodiment of the present disclosure.

Referring to the drawing, a signal processing device 170b according to an embodiment of the present disclosure may include a first circuit 410b configured to operate at a first clock frequency (e.g., CLK_b) and to transmit an asynchronous N-bit signal, and a second circuit 420b configured to operate at a second clock frequency (e.g., CLK_B), which is different from the first clock frequency, and to receive the asynchronous N-bit signal from the first circuit 410a.

Meanwhile, the first circuit 410b may include the data transmitter 810 configured to transmit the asynchronous N-bit signal to the second circuit 420b.

Meanwhile, the second circuit 420b may include the data receiver 830 configured to receive the asynchronous N-bit signal from the first circuit 410b.

Meanwhile, for detecting an error and the like upon receiving the asynchronous N-bit signal, the second circuit 420b may include a delay synchronization processing device 500a which is the same as the delay synchronization processing device 500 described above with reference to FIGS. 6A to 7.

As described above, the delay synchronization processing device 500a may include the delay device 615 configured to generate a random number and to delay an input asynchronous N-bit signal based on the generated random number, and the synchronization processor 620 configured to perform synchronization processing on the asynchronous N-bit signal delayed by the delay device 615.

Accordingly, an error may be detected between the first circuit 410a and the second circuit 420a which operate at different clock frequencies.

Meanwhile, the first circuit 410b may include a request signal generator 815 configured to generate a request signal to be transmitted to the second circuit 420b, and a second delay synchronization processing device 500b configured to perform delay and synchronization processing on the request signal.

Particularly, an error during transmission of the request signal may be detected by the second delay synchronization processing device 500b.

Meanwhile, the second circuit 420b may include an acknowledge (ACK) signal generator 835 configured to generate an ACK signal to be transmitted to the first circuit 410b, and a third delay synchronization processing device 500b' configured to perform delay and synchronization processing on the ACK signal.

Particularly, an error during transmission of the ACK signal may be detected by the third delay synchronization processing device 500b'.

Figure 10:
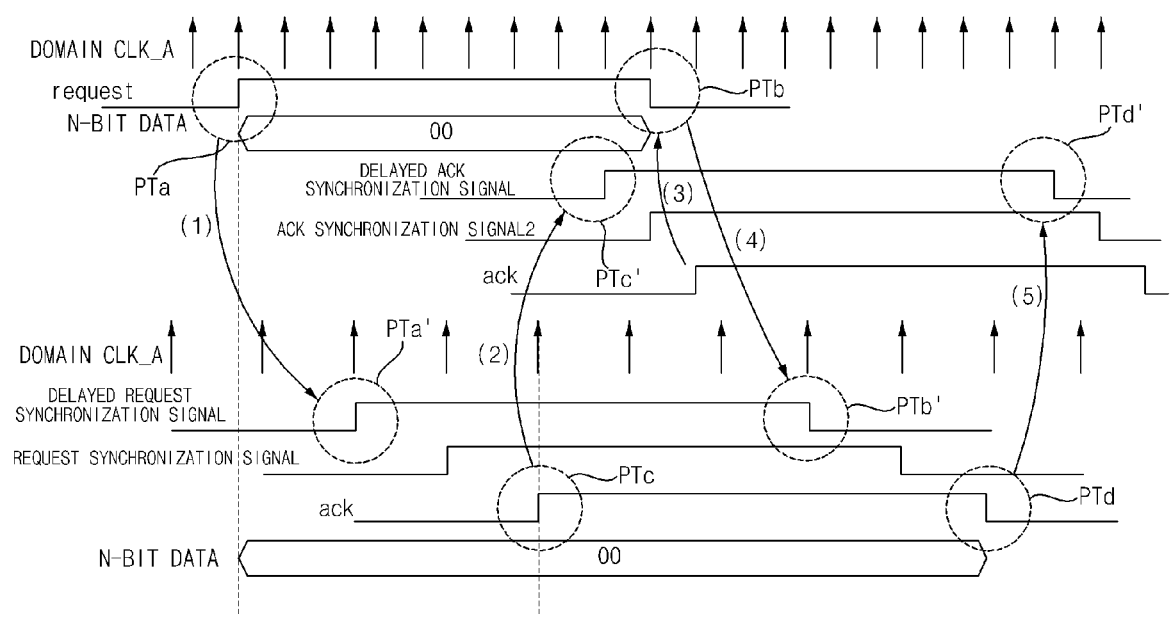

FIG. 10 is a diagram referred to in the description of the operation of FIG. 9.

Referring to the drawing, when a request signal of domain CLK_A in the first circuit 410b rises to "1," the request signal passes through the second delay synchronization processing device 500b to reach domain CLK_B in the second circuit 420b.

Accordingly, N-bit data transmission from the first circuit 410b to the second circuit 420b begins.

Then, when the second circuit 420b raises an ACK signal to "1," the ACK signal passes through the third delay synchronization processing device 500b' to reach the domain CLK_A in the first circuit 410b.

In addition, a timing at which the ACK signal is "1" is a timing at which the N-bit data may be safely used in the domain CLK_B.

Then, the request signal falls to "0" by using the ACK signal in domain CLK_A in the first circuit 410b.

Subsequently, when the request signal of the domain CLK_A in the first circuit 410b falls to "0," the request signal passes through the second delay synchronization processing device 500b to reach the domain CLK_B in the second circuit 420b.

Next, when the ACK signal of the domain CLK_B in the second circuit 420b falls to "0," the ACK signal passes through the third delay synchronization processing device 500b' to reach the domain CLK_A in the first circuit 410b.

In the drawing, a timing PTa of the domain CLK_A in the first circuit 410b may be a time point at which the request signal transitions to a high level of "1," and may correspond to a timing PTa' of the domain CLK_B in the second circuit 410b.

That is, the domain CLK_B in the second circuit 410b may receive the request signal that passes through the second delay synchronization processing device 500b to transition to the high level of "1" at the timing PTa'.

In the drawing, a timing PTb of the domain CLK_A in the first circuit 410b may be a time point at which the request signal transitions to a low level of "0," and may correspond to a timing PTb' of the domain CLK_B in the second circuit 410b.

That is, the domain CLK_B in the second circuit 410b may receive the request signal that passes through the second delay synchronization processing device 500b to transition to the low level of "0" at the timing PTb'.

In the drawing, a timing PTc of the domain CLK_B in the second circuit 420b may be a time point at which the ACK signal transitions to a high level of "1," and may correspond to a timing PTc' of the domain CLK_A in the first circuit 410a.

That is, the domain CLK_A in the first circuit 410a may receive the ACK signal that passes through the third delay synchronization processing device 500b' to transition to the high level of "1" at the timing PTc'.

In the drawing, a timing PTd of the domain CLK_B in the second circuit 420b may be a time point at which the ACK signal transitions to a low level of "0," and may correspond to a timing PTd' of the domain CLK_A in the first circuit 420b.

That is, the domain CLK_A in the first circuit 410a may receive the ACK signal that passes through the third delay synchronization processing device 500b' to transition to the low level of "0" at the timing PTd'.

Based on the timing diagram, it is possible to detect an error during transmission of the asynchronous N-bit signal, an error during transmission of the request signal, an error during transmission of the ACK signal, and the like.

Figure 11A:
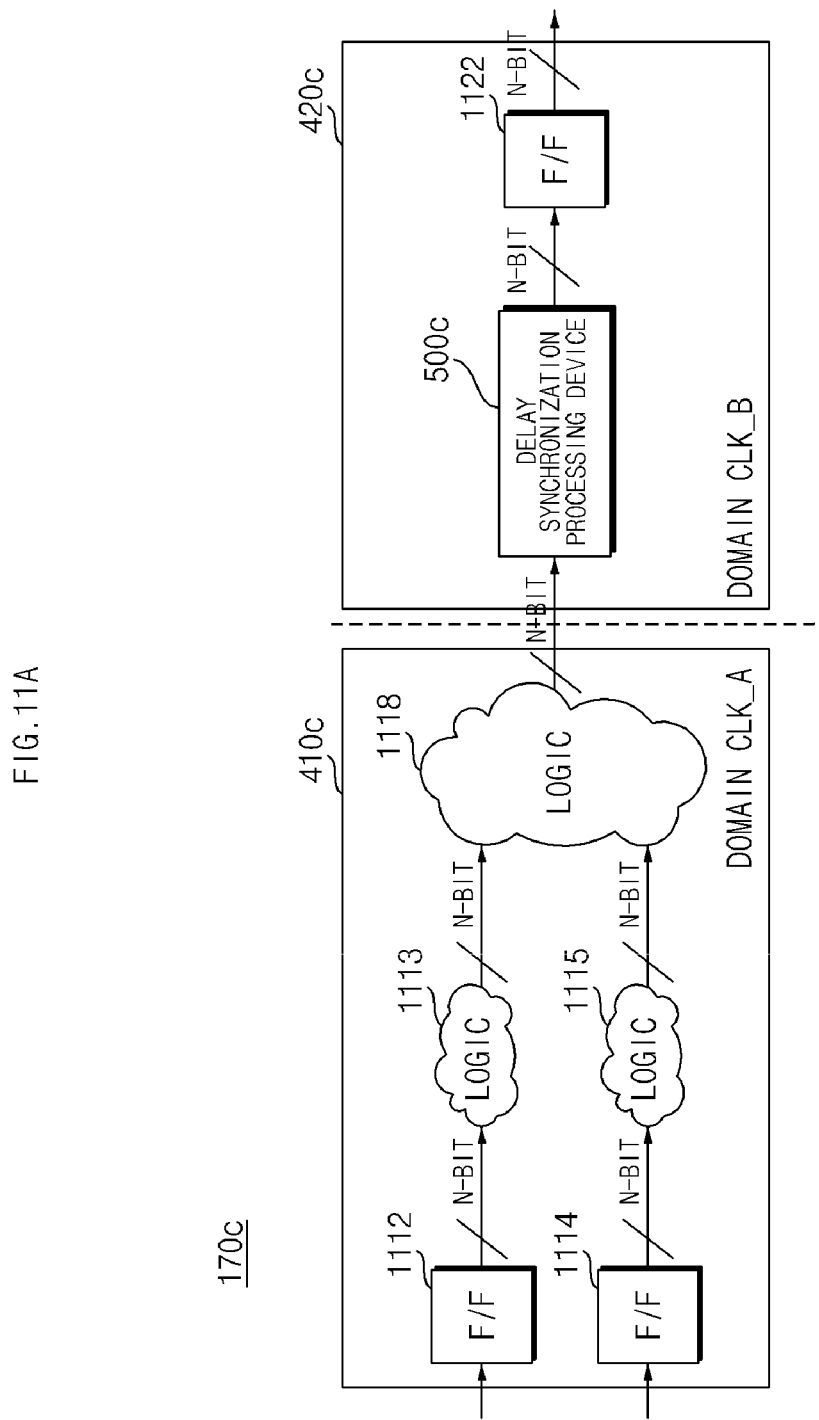
Figure 11B:
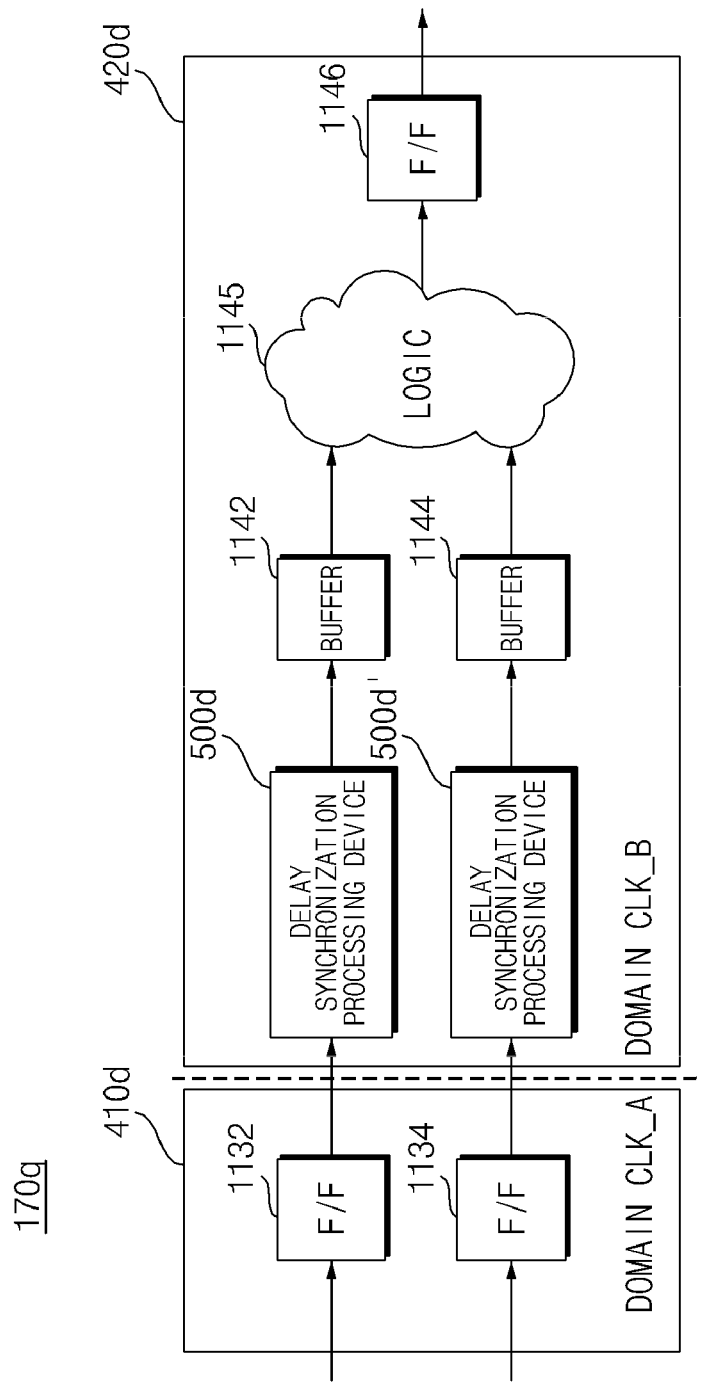

FIGS. 11A and 11B are diagrams illustrating various examples of a signal processing device according to an embodiment of the present disclosure.

First, referring to FIG. 11A, a signal processing device 170c according to an embodiment of the present disclosure may include a first circuit 410c configured to operate at the first clock frequency (e.g., CLK_b) and to transmit an asynchronous N-bit signal, and a second circuit 420c configured to operate at the second clock frequency (e.g., CLK_B), which is different from the first clock frequency, and to receive the asynchronous N-bit signal from the first circuit 410a.

The first circuit 410c may include a plurality of flip-flops 1112 and 1114 a plurality of logics 1113 and 1115, and a transmission logic 1118.

The second circuit 420c may include a delay synchronization processing device 500c configured to perform delay and synchronization processing on the asynchronous N-bit signal from the first circuit 410c, and a flip-flop 1122 disposed at an output terminal of the delay synchronization processing device 500c. Accordingly, an error during transmission of the asynchronous N-bit signal may be detected.

Next, referring to FIG. 11B, a signal processing device 170d according to an embodiment of the present disclosure may include a first circuit 410d configured to operate at the first clock frequency (e.g., CLK_b) and to transmit an asynchronous N-bit signal, and a second circuit 420d configured to operate at the second clock frequency (e.g., CLK_B), which is different from the first clock frequency, and to receive the asynchronous N-bit signal from the first circuit 410d.

The first circuit 410d may include the plurality of flip-flops 1112 and 1114.

The second circuit 420d may include a plurality of delay synchronization processing devices 500d and 500d' configured to perform delay and synchronization processing on each of a plurality of asynchronous N-bit signals from the first circuit 410c, buffers 1142 and 1144 disposed at an output terminal of each of the delay synchronization processing devices 500d and 500d', a logic 1145 disposed at output terminals of the buffers 1142 and 1144, and a flip-flop 1146.

Accordingly, an error during transmission of the plurality of asynchronous N-bit signals may be detected.

Figure 12A:
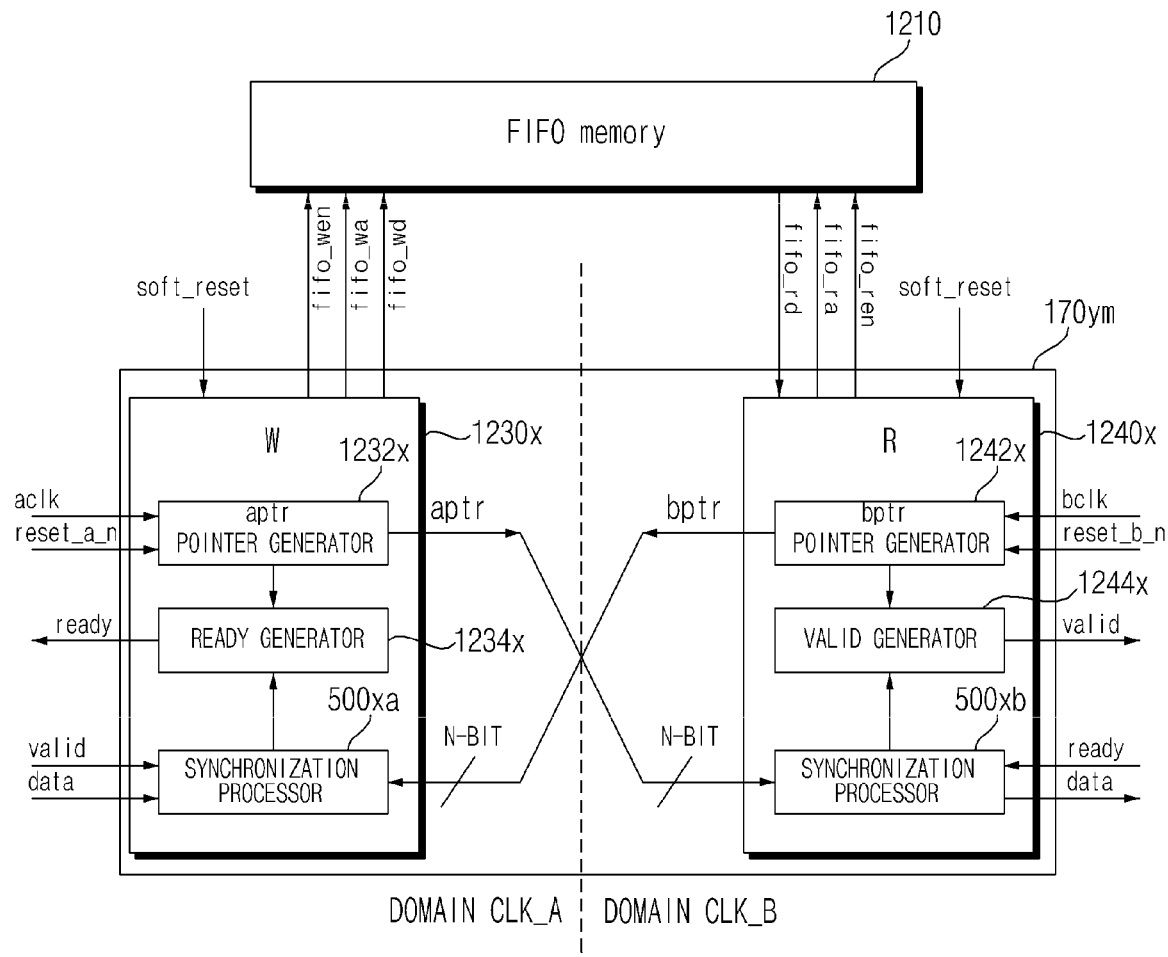

FIG. 12A is a diagram illustrating an image display device 1200x associated with the present disclosure.

Referring to the drawing, the image display device 1200x associated with the present disclosure may include a signal processing device 170ym and a memory 1210 that operates asynchronously.

A first circuit 1230x of the signal processing device 170ym operates at the first clock frequency as in CLK_A, and a second circuit 1230x operates at the second clock frequency as in CLK_B.

The first circuit 1230x operates to write data to the memory 1210, and the second circuit 1230x operates to read data from the memory 1210.

To this end, the first circuit 1230x may include a pointer generator 1232x, a ready generator 1234x, and a synchronization processor 500xa.

Meanwhile, the second circuit 1240x may include a pointer generator 1242x, a ready generator 1244x, and a synchronization processor 500xb.

N-bit data from the pointer generator 1242x of the second circuit 1240x is input to the synchronization processor 500xa of the first circuit 1230x, but error detection during data transmission may not be performed.

Meanwhile, N-bit data from the pointer generator 1232x of the first circuit 1230x is input to the synchronization processor 500xb of the second circuit 1240x, but error detection during data transmission may not be performed.

Figure 12B:
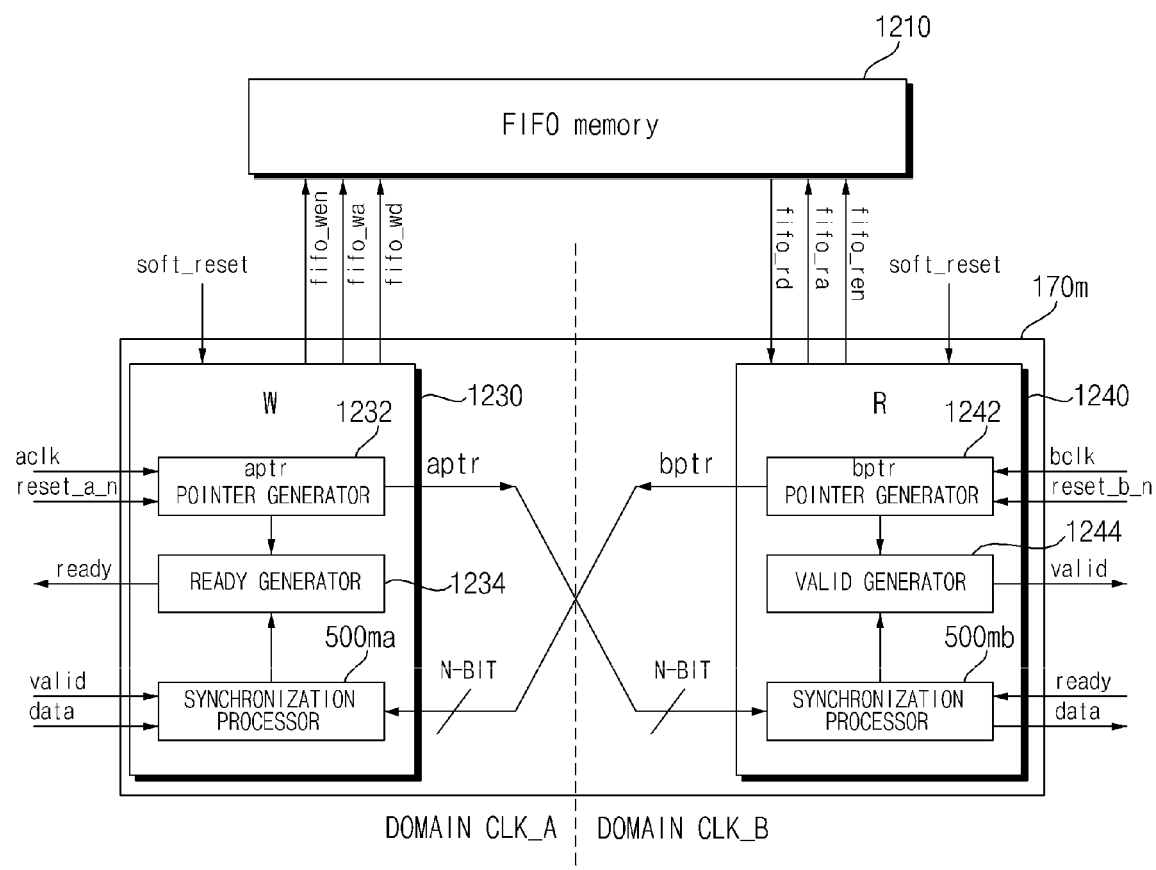

FIG. 12B is a diagram illustrating an image display device 1200 according to an embodiment of the present disclosure.

Referring to the drawing, the image display device 1200 according to an embodiment of the present disclosure may include a signal processing device 170m and the memory 1210 that operates asynchronously.

A first circuit 1230 of the signal processing device 170m operates at the first clock frequency as in CLK_A, and a second circuit 1230 operates at the second clock frequency as in CLK_B.

The first circuit 1230 operates to write data to the memory 1210, and the second circuit 1230 operates to read data from the memory 1210.

To this end, the first circuit 1230 may include a pointer generator 1232, a ready generator 1234, and a delay synchronization processor 500ma.

Meanwhile, the second circuit 1240 may include a pointer generator 1242, a ready generator 1244, and a delay synchronization processor 500mb.

N-bit data from the pointer generator 1242 of the second circuit 1240 is input to the delay synchronization processor 500ma of the first circuit 1230, and an error during data transmission may be detected by performing delay and synchronization processing.

Meanwhile, N-bit data from the pointer generator 1232 of the first circuit 1230 is input to the delay synchronization processor 500mb of the second circuit 1240, and an error during data transmission may be detected by performing delay and synchronization processing.

Figure 13A:
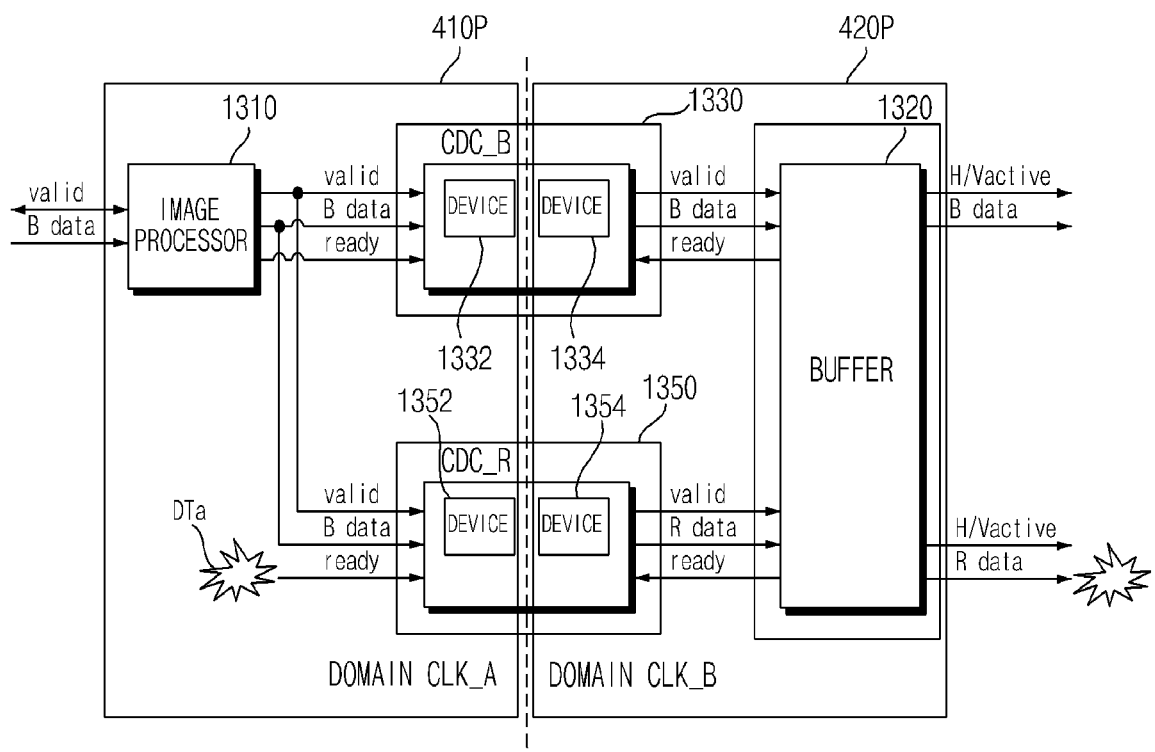

FIG. 13A is a diagram illustrating further another example of a signal processing device according to an embodiment of the present disclosure.

Referring to the drawing, a signal processing device 170p according to an embodiment of the present disclosure may include a first circuit 410P operating at the first clock frequency as in CLK_A, and a second circuit 420P operating at the second clock frequency as in CLK_B.

The first circuit 410P may include an image processor 1310 configured to process an image signal, and delay synchronization processing devices CDC_B and CDCR configured to perform delay and synchronization processing.

The second circuit 420P may include a buffer 1320 configured to store an image signal from the image processor 1310, and delay synchronization processing devices CDC_B and CDCR configured to perform delay and synchronization processing.

As illustrated in the drawing, some 1332 and 1352 of the delay synchronization processing devices CDC_B and CDCR may be disposed in the first circuit 410P, and others 1334 and 1354 thereof may be disposed in the second circuit 420P.

For example, during transmission of data of C component of the image signal in different clock domains, it is preferable to use the delay synchronization processing device 500 of FIG. 6A, instead of the synchronization processor 520 of FIG. 5A used in an asynchronous structure.

This is because, assuming that CDC_B and CDC_R are in the same state, if a ready signal of CDC_R is not connected, malfunction of the structure may be detected by the delay synchronization processing device 500 of FIG. 6A.

FIG. 13B is a timing diagram of a case where the synchronization processor 520 of FIG. 5A is used in the signal processing device 170p.

Referring to the drawing, in the domain CLK_A, valid signals of the same timing are applied as inputs to CDC_B and CDC_R. Further, in the domain CLK_B, ready signals of the same timing are applied as inputs to CDC_B and CDC_R.

Even when the signals of the same timing are applied, internal states of CDC_B and CDC_R should be different from each other due to an asynchronous operation performed by the synchronization processor 520 of FIG. 5A, but the asynchronous operation is not performed in the RTL simulation, such that CDC_B and CDC_R are changed to the same state.

For this reason, the same valid signal and data are input to CDC_B and CDC_R in response to the ready signal of CDC_B instead of the ready signal of CDC_R, and the ready signal of CDC_R is in a state to receive data as shown by Arpa of the drawing, such that data A of CDC_R is stored, and when data of CRC R is finally output, data B may be normally output.

As a result, the ready signal of CDC_R is not connected to a poorly designed part DTa in FIG. 11A, such that malfunction in data is supposed to occur since it is impossible to notify a state of CDC_R to a C image signal processor, but for the aforementioned reason, the asynchronous operation of CDC_R is not performed in the existing RTL simulation, such that malfunction is not detected in an asynchronous processing structure.

Figure 13C:
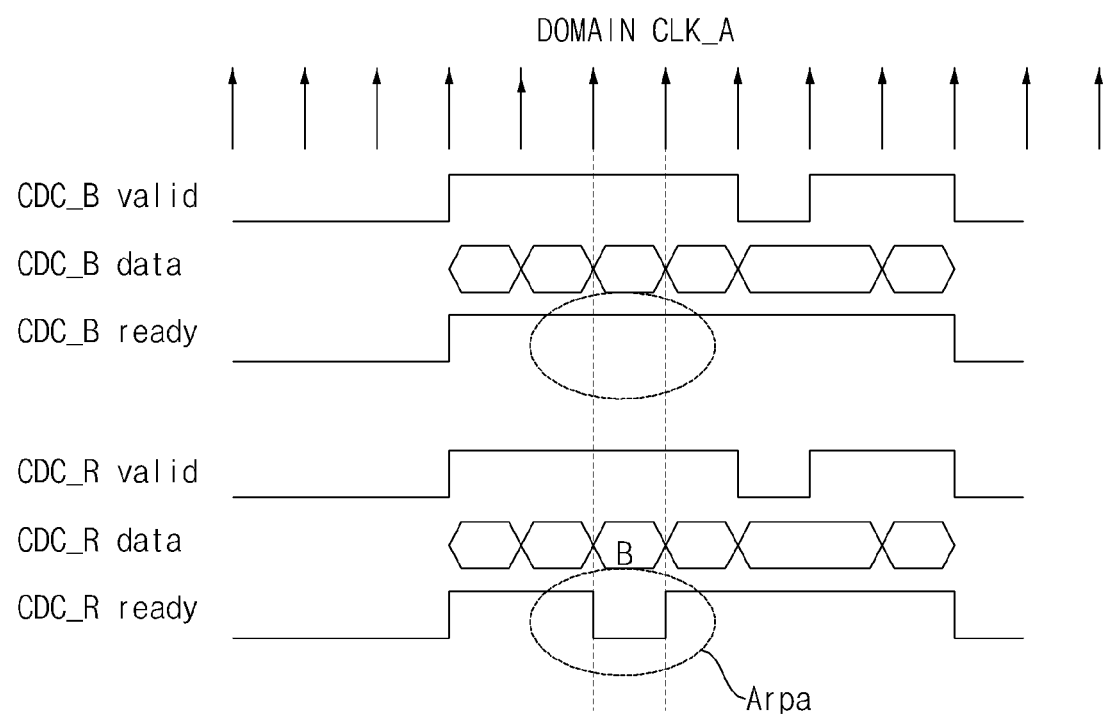

FIG. 13C is a timing diagram of a case where the synchronization processor 520 of FIG. 5A is used in the signal processing device 170p.

Referring to the drawing, an asynchronous operation occurs in each of CDC_B and CDC_R of the domain CLK_A, such that CDC_B and CDC_R are in different states, and different ready signals are generated.

Even in this case, the same valid signal and data are input to CDC_B and CDC_R in response to the ready signal of CDC_B instead of the ready signal of CDC_R, and the ready signal of CDC_R is not in a state to receive data as shown by Arpb of the drawing, such that data B of CDC_R may not be stored, and when data of CDC_R is finally output, data B is omitted.

Accordingly, it can be seen that an asynchronous processing structure is poorly designed, and it is possible to detect an error in the RTL simulation.

It will be apparent that, although the preferred embodiments have been illustrated and described above, the present disclosure is not limited to the above-described specific embodiments, and various modifications and variations can be made by those skilled in the art without departing from the gist of the appended claims. Thus, it is intended that the modifications and variations should not be understood independently of the technical spirit or prospect of the present disclosure.

What is claimed is:

1. A delay synchronization processing device comprising:
    a delay device configured to generate a random number and to delay an input asynchronous N-bit signal based on the generated random number;
    a synchronization processor configured to perform synchronization processing on the asynchronous N-bit signal delayed by the delay device;
    a second synchronization processor configured to perform synchronization processing on the input asynchronous N-bit signal; and
    a first switch, which in response to a delay synchronization selection signal, is configured to transmit the input asynchronous N-bit signal to the delay device or the second synchronization processor.

2. The delay synchronization processing device of claim 1, wherein the delay device is configured to delay each bit of the input asynchronous N-bit signal based on the generated random number and to output the delayed signal.

3. The delay synchronization processing device of claim 1, wherein the delay device is configured to set a delay time for the each bit of the input asynchronous N-bit signal based on the generated random number,
    wherein the set delay time is different for the each bit.

4. The delay synchronization processing device of claim 1, wherein the delay device is configured to set a random number of the each bit of the input asynchronous N-bit signal to a multiple of a clock period.

5. The delay synchronization processing device of claim 1, wherein in response to the input asynchronous N-bit signal being a Gray code signal, the delay device is configured to output a normal bit signal without bit error.

6. The delay synchronization processing device of claim 1, wherein the delay device is configured to receive a random number generation control signal, and to generate the random number based on the random number generation control signal.

7. The delay synchronization processing device of claim 6, wherein based on the random number generation control signal, the delay device is configured to generate the random number at varying intervals or to adjust a range for generating the random number.

8. The delay synchronization processing device of claim 6, wherein based on the random number generation control signal, the delay device is configured to perform or not perform some of an operation of generating the random number.

9. The delay synchronization processing device of claim 6, wherein based on random seed information included in the random number generation control signal, the delay device is configured to generate the random number.

10. The delay synchronization processing device of claim 1, further comprising a second switch connected to an output terminal of the second synchronization processor and an output terminal of the synchronization processor, and configured to selectively output an output of the second synchronization processor or an output of the synchronization processor.

11. The delay synchronization processing device of claim 10, further comprising:
    a third switch configured to receive a clock signal and to selectively output the clock signal to the synchronization processor or the second synchronization processor; and
    a fourth switch configured to receive a reset signal and to selectively output the reset signal to the synchronization processor or the second synchronization processor.

12. The delay synchronization processing device of claim 1, wherein the synchronization processor comprises:
    a first flip-flop;
    a second flip-flop connected to an output terminal of the first flip-flop; and
    a fifth switch connected to the output terminal of the first flip-flop and an output terminal of the second flip-flop, and to selectively output an output of the first flip-flop or an output of the second flip-flop.

13. The delay synchronization processing device of claim 12, further comprising a third flip-flop connected to an output terminal of the fifth switch.

14. A signal processing device comprising a delay synchronization processing device,
    wherein the delay synchronization processing device comprises:
    a delay device configured to generate a random number and to delay an input asynchronous N-bit signal based on the generated random number; and
    a synchronization processor configured to perform synchronization processing on the asynchronous N-bit signal delayed by the delay device,
    wherein the delay synchronization processing device further comprises:
    a second synchronization processor configured to perform synchronization processing on the input asynchronous N-bit signal; and
    a first switch, which in response to a delay synchronization selection signal, is configured to transmit the input asynchronous N-bit signal to the delay device or the second synchronization processor.

15. The signal processing device of claim 14, comprising:
    a first circuit configured to operate at a first clock frequency and to transmit the asynchronous N-bit signal; and
    a second circuit configured to operate at a second clock frequency, which is different from the first clock frequency, and to receive the asynchronous N-bit signal from the first circuit,
    wherein the delay synchronization processing device is located at a front end of the second circuit.

16. The signal processing device of claim 15, wherein the first circuit comprises:
    a data transmitter configured to transmit the asynchronous N-bit signal to the second circuit;
    a request signal generator configured to generate a request signal; and
    a second delay synchronization processing device configured to perform delay and synchronization processing on the request signal.

17. The signal processing device of claim 15, wherein the second circuit comprises:
    a data receiver configured to receive the asynchronous N-bit signal from the first circuit;
    an acknowledge (ACK) signal configured to generate an ACK signal; and a third delay synchronization processing device configured to perform delay and synchronization processing on the ACK signal.

18. The signal processing device of claim 14, wherein the synchronization processor comprises:
a first flip-flop;
a second flip-flop connected to an output terminal of the first flip-flop; and
a fifth switch connected to the output terminal of the first flip-flop and an output terminal of the second flip-flop, and to selectively output an output of the first flip-flop or an output of the second flip-flop.

\* \* \* \* \*